United States Patent
Saito

(10) Patent No.: US 8,709,889 B2
(45) Date of Patent: Apr. 29, 2014

(54) SEMICONDUCTOR MEMORY DEVICE AND MANUFACTURING METHOD THEREOF

(75) Inventor: Toshihiko Saito, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 149 days.

(21) Appl. No.: 13/471,667

(22) Filed: May 15, 2012

(65) Prior Publication Data

US 2012/0292615 A1 Nov. 22, 2012

(30) Foreign Application Priority Data

May 19, 2011 (JP) ................................ 2011-112102

(51) Int. Cl.
*H01L 21/8242* (2006.01)
*H01L 27/108* (2006.01)

(52) U.S. Cl.
USPC .......................................... 438/239; 257/296

(58) Field of Classification Search
USPC .................... 257/288, 296, 311; 438/239, 253
See application file for complete search history.

(56) References Cited

U.S. PATENT DOCUMENTS

| | | | |
|---|---|---|---|
| 4,466,081 A | 8/1984 | Masuoka | |
| 5,528,032 A | 6/1996 | Uchiyama | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |

(Continued)

FOREIGN PATENT DOCUMENTS

| EP | 1 737 044 A1 | 12/2006 |
|---|---|---|
| EP | 2 226 847 A2 | 9/2010 |

(Continued)

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Calvin Lee
(74) *Attorney, Agent, or Firm* — Fish & Richardson P.C.

(57) ABSTRACT

A memory cell therein includes a first transistor and a capacitor and stores data corresponding to a potential held in the capacitor. The first transistor includes a pair of electrodes, an insulating film in contact with side surfaces of the electrodes, a first gate electrode provided between the electrodes with the insulating film provided between the first gate electrode and each electrode and whose top surface is at a lower level than top surfaces of the electrodes, a first gate insulating film over the first gate electrode, an oxide semiconductor film in contact with the first gate insulating film and the electrodes, a second gate insulating film at least over the oxide semiconductor film, and a second gate electrode over the oxide semiconductor film with the second gate insulating film provided therebetween. The capacitor is connected to the first transistor through one of the electrodes.

24 Claims, 28 Drawing Sheets

(56) References Cited

U.S. PATENT DOCUMENTS

| | | | |
|---|---|---|---|
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,067,775 B2* | 11/2011 | Miyairi et al. | 257/72 |
| 8,106,400 B2 | 1/2012 | Miyairi et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0215869 A1* | 9/2007 | Moriya et al. | 257/40 |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0101351 A1 | 5/2011 | Yamazaki | |
| 2011/0147737 A1* | 6/2011 | Yamazaki et al. | 257/43 |
| 2011/0156028 A1 | 6/2011 | Yamazaki et al. | |
| 2011/0157961 A1 | 6/2011 | Yamazaki et al. | |
| 2011/0198554 A1 | 8/2011 | Iijima et al. | |
| 2012/0061668 A1 | 3/2012 | Miyairi et al. | |

FOREIGN PATENT DOCUMENTS

| | | |
|---|---|---|
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-003598 A | 1/2011 |
| JP | 2011-171393 A | 9/2011 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZNO Thin-Film Transistors Produced at Temperature," Appl. Phys. Lett. (Applied Physics Letters), Sep. 27, 2004, vol. 85, No. 13, pp. 2541-2543.

(56) References Cited

OTHER PUBLICATIONS

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependance of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZNO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancles in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3—A2O3—BO Systems [A; FE, GA, or AL; B: MG, MN, FE, NI, CU,or ZN] at Temperatures Over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K. et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn—Oxide TFTS With a Novel Passivation Layer," SID

(56) References Cited

OTHER PUBLICATIONS

Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

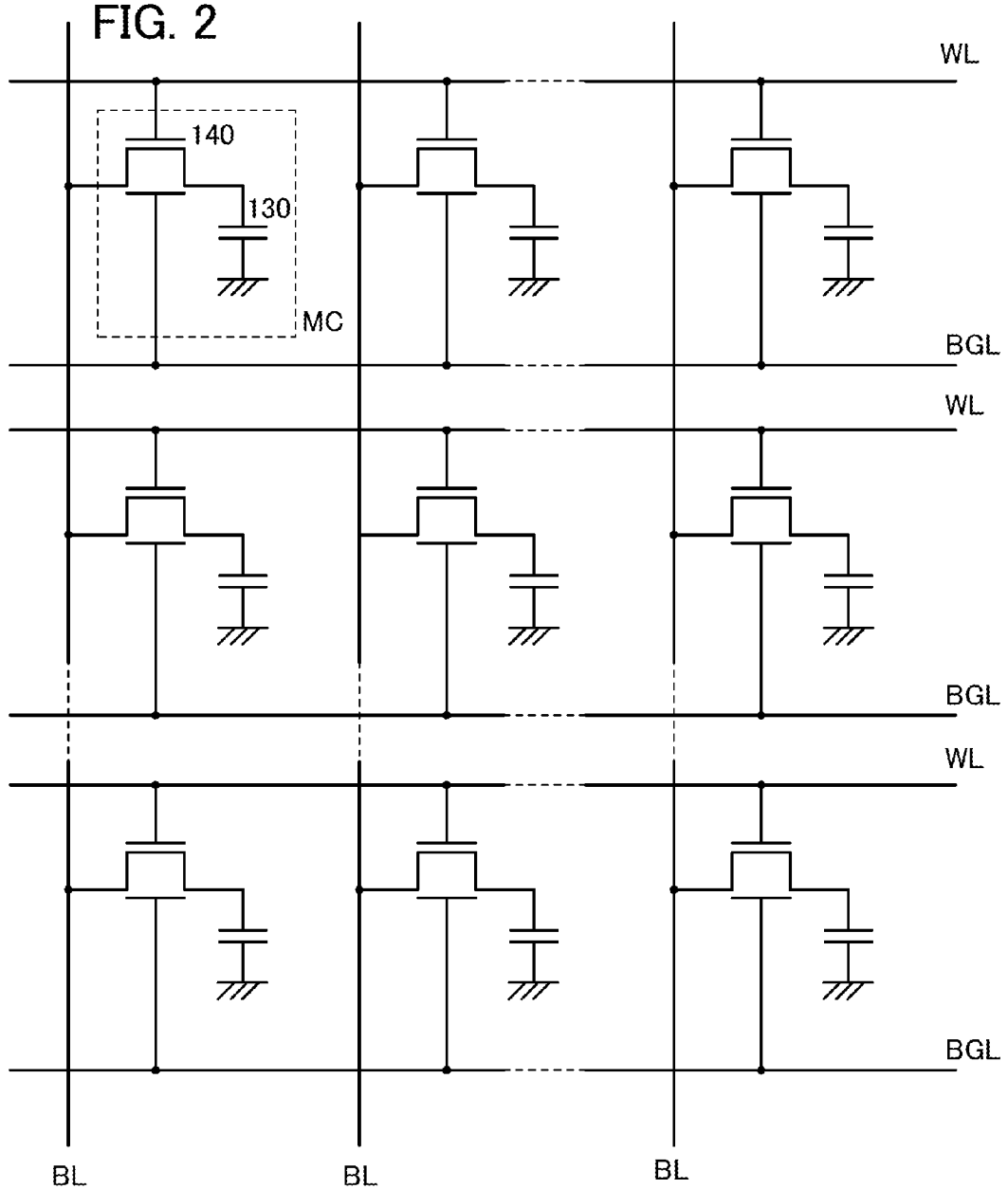

● In
○ Sn
· Zn
● O

FIG. 15A
FIG. 15B
FIG. 15C
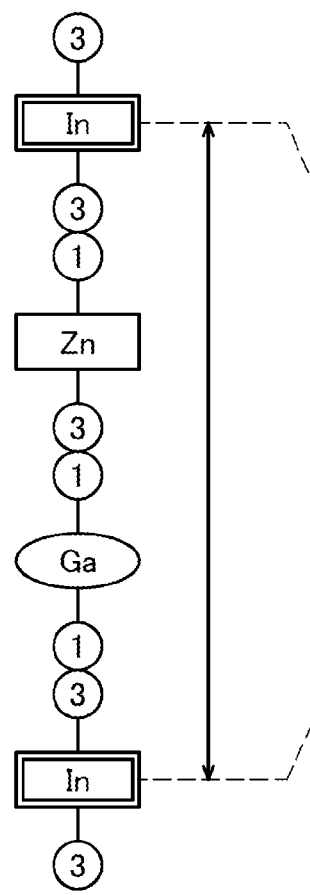
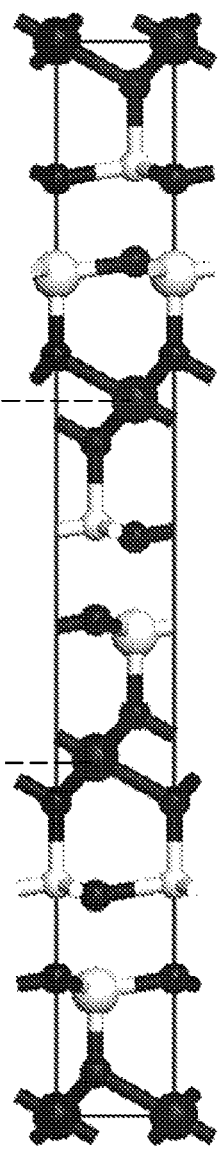
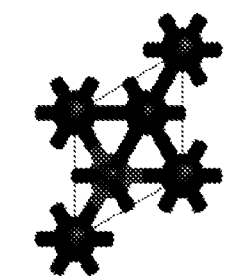
- In
- Ga
- Zn
- O

- In
- Ga or Zn
- O

- In
- Ga
- Zn
- O

SEMICONDUCTOR MEMORY DEVICE AND MANUFACTURING METHOD THEREOF

BACKGROUND OF THE INVENTION

1. Field of the Invention

The present invention relates to a semiconductor memory device which includes a circuit including a semiconductor element such as a transistor.

2. Description of the Related Art

Semiconductor memory devices are roughly classified into two categories: a volatile device that loses stored data when power supply stops, and a non-volatile device that retains stored data even when power is not supplied.

A typical example of a volatile semiconductor memory device is a dynamic random access memory (DRAM). In the DRAM, a transistor is selected and electric charge is accumulated in a capacitor connected to the transistor, whereby data is stored.

In the DRAM, electric charge accumulated in the capacitor is lost as data is read out, and thus rewriting of data is needed every reading of data. Further, the electrical charge is also lost due to, for example, a leakage current (off-state current) between a source and a drain of the transistor in the DRAM when the transistor is off; therefore, the data retention period is short. Accordingly, a writing operation (refresh operation) needs to be performed at certain intervals, which increases power consumption. Further, since data is lost when power supply stops, another type of memory device using a magnetic material or an optical material is further needed to retain data for a long period of time after power supply stops.

Another example of the volatile semiconductor memory device is an SRAM (static random access memory). The SRAM retains stored data by using a circuit such as a flip-flop and thus does not need a refresh operation, which is an advantage over the DRAM. However, cost per storage capacity is higher because the circuit such as a flip-flop is used. Further, as in the DRAM, stored data in the SRAM is lost when power supply stops.

A typical example of a non-volatile semiconductor memory device is flash memory. The flash memory includes a floating gate between a gate electrode and a channel region of a transistor and stores data by holding electric charge in the floating gate. Therefore, the flash memory has advantages in that the data retention period is extremely long and a refresh operation, which is needed in the DRAM, is not needed (e.g., see Patent Document 1).

However, a gate insulating film included in the flash memory is deteriorated by tunneling current generated in data writing, and thus a certain number of data writings cause a failure of the semiconductor memory device. To suppress an adverse effect of this problem, for example, a method of equalizing the number of writing operations between memory cells is employed, in which case a complicated peripheral circuit is needed. Further, such a method does not solve the fundamental problem of lifetime. Therefore, the flash memory is not suitable for applications involving frequent data rewritings.

Further, the flash memory needs high voltage for injecting electric charge in the floating gate or removing the electric charge. A circuit for that purpose is also needed. In addition, it takes a relatively long time to inject or remove the electric charge, and thus it is not easy to increase the speed of writing and erasing data.

Transistors included in the above-described semiconductor memory devices use mainly a silicon semiconductor. A transistor using an oxide semiconductor, which has drawn attention in recent years, exhibits higher field-effect mobility than a transistor using amorphous silicon. Therefore, such a transistor using an oxide semiconductor has been expected to replace the transistor using amorphous silicon.

REFERENCE

Patent Document 1: Japanese Published Patent Application No. S57-105889

SUMMARY OF THE INVENTION

It is an object of one embodiment of the present invention to provide a semiconductor memory device having a novel structure in which unlike conventional DRAMs, data can be retained without frequent refresh operations and the number of times of writing operations is not limited.

Further, it is an object of one embodiment of the present invention to increase the integration degree of a semiconductor memory device having the above-described novel structure to increase storage capacity per unit area.

One embodiment of the present invention is a semiconductor memory device including a memory cell which includes a first transistor and a capacitor and stores data corresponding to a potential held in the capacitor. The first transistor includes a pair of electrodes, an insulating film provided in contact with respective side surfaces of the pair of electrodes, a first gate electrode which is provided between the pair of electrodes with the insulating film provided between the first gate electrode and each electrode and whose top surface is at a lower level than respective top surfaces of the pair of electrodes, a first gate insulating film provided over the first gate electrode, an oxide semiconductor film provided in contact with the first gate insulating film and the pair of electrodes, a second gate insulating film provided at least over the oxide semiconductor film, and a second gate electrode provided over the oxide semiconductor film with the second gate insulating film provided therebetween. The capacitor includes a pair of electrodes one of which also functions as one of the pair of electrodes of the first transistor.

Note that the "level" of the top surface refers to the height above the level of a substrate surface.

In one embodiment of the present invention, data is distinguished by whether the potential held in the capacitor is high or low in the memory cell of the semiconductor memory device.

In one embodiment of the present invention, the memory cell further includes a second transistor whose gate is connected to one of the pair of electrodes of the first transistor and the capacitor. The second transistor is turned on or off in accordance with the potential held in the capacitor, whereby data is distinguished.

The pair of electrodes in the first transistor is provided such that the distance therebetween is the minimum feature size (also denoted by F).

The first gate electrode is provided between a source electrode and a drain electrode (the pair of electrodes) with the insulating film, which is provided in contact with at least the side surfaces of the source and drain electrodes, provided between the first gate electrode and each of the source and drain electrodes, where the distance between the source and drain electrodes is F. Therefore, the width of the first gate electrode is smaller than F by twice the thickness of the insulating film.

The first gate electrode can be formed by forming a conductive film over the insulating film so as to fill a space between the source and drain electrodes and then removing part thereof overlapping with the source and drain electrodes by chemical mechanical polishing (CMP). The first gate electrode can be thus formed in a self-aligned manner, resulting in a width of the first gate electrode which is less than F. Accordingly, the size of each memory cell can be reduced, whereby the integration degree of the semiconductor device can be increased.

As for the first gate electrode and the first gate insulating film, a formation method is briefly described below. The first gate electrode is provided such that the top surface is at a lower level than the respective top surfaces of the pair of electrodes, and an insulating film serving as the first gate insulating film is formed over the first gate electrode and the pair of electrodes. Then, the insulating film serving as the first gate insulating film is removed by CMP until the top surfaces of the pair of electrodes are exposed. In this manner, the first gate insulating film can be formed. The first gate insulating film thus formed lies between the pair of electrodes with the insulating film provided between the first gate insulating film and each of the electrodes, and lies directly above the first gate electrode.

Until now the technology for controlling electrical characteristics such as the threshold voltage has been established in transistors using a silicon semiconductor, but not yet in transistors using an oxide semiconductor. Specifically, the threshold voltage can be controlled by, for example, doping with impurities in the transistors using a silicon semiconductor material, but such a control of the threshold voltage by impurity doping or the like is difficult in the transistors using an oxide semiconductor material.

The threshold voltage of the first transistor having the above-described structure can be controlled by applying a potential to the first gate electrode. To keep the potential of the first gate electrode stable even after a power supply potential is stopped being supplied, a capacitor and a switch may be provided to be connected to the first gate electrode.

The first gate electrode is provided to surround the memory cell. Therefore, the first gate electrode functions as a guard ring, thereby preventing electrostatic breakdown of the semiconductor device; accordingly, the semiconductor device with high reliability can be provided with high manufacturing yield.

For the oxide semiconductor film, a material whose band gap is greater than or equal to 2.5 eV, preferably greater than or equal to 2.8 eV, further preferably greater than or equal to 3.0 eV is used. Such a band gap leads to a reduction in the off-state current of the transistor. Any material other than oxide semiconductors, having such a band gap described above and semiconductor characteristics may be used as well.

It is preferable that the oxide semiconductor film be highly purified so as to contain as few impurities (such as hydrogen, an alkali metal, an alkaline earth metal, a rare gas, nitrogen, phosphorus, and boron) causing carriers directly or indirectly as possible. Furthermore, it is preferable that oxygen vacancies in the oxide semiconductor film are as few as possible. By reducing impurities and oxygen vacancies in the oxide semiconductor film, generation of unintentional carriers is suppressed, and thus the off-state current of the transistor can be reduced.

In this manner, the first transistor is formed to have less off-state current, whereby electric charge in the capacitor can be retained for a long period after the first transistor is turned off. Accordingly, a semiconductor memory device capable of retaining data for a long period can be provided.

The transistor whose threshold voltage is controlled and whose off-state current is extremely small is used, whereby a semiconductor memory device with less refresh operations and thus less power consumption can be provided.

Further, a semiconductor memory device in which the area of each memory cell is small and whose integration degree is high can be provided.

Further, the conductive film which is equipotential is provided so as to surround the memory cell, whereby a semiconductor memory device having a function as a guard ring in which electrostatic breakdown is less likely to occur can be provided.

BRIEF DESCRIPTION OF THE DRAWINGS

In the accompanying drawings:

FIG. 2 is a circuit diagram showing an example of a memory cell array in which the memory cells each of which is shown in FIGS. 1A and 1B are arranged in matrix;

FIGS. 15A to 15C are diagrams illustrating a crystal structure of an oxide semiconductor according to one embodiment of the present invention;

DETAILED DESCRIPTION OF THE INVENTION

Figure 1A:
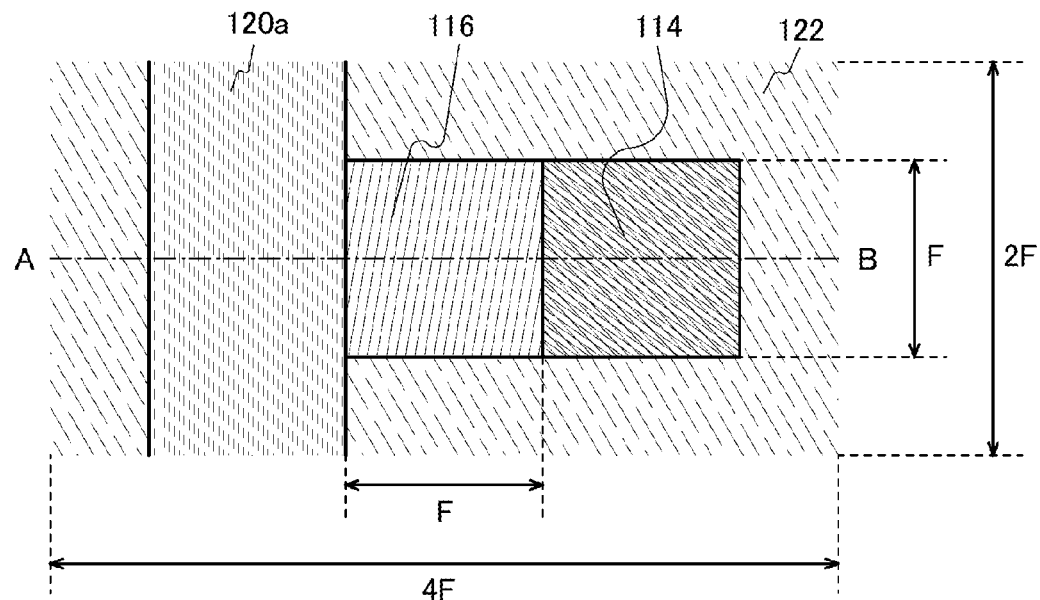
FIGS. 1A and 1B are a top view and a cross-sectional view showing an example of a memory cell included in a semiconductor memory device.

Hereinafter, embodiments of the present invention are described in detail with reference to the accompanying drawings. However, the present invention is not limited to the description below, and it will be easily understood by those skilled in the art that modes and details disclosed herein can be modified in various ways. Therefore, the present invention is not construed as being limited to description of the embodiments. In describing structures of the present invention with reference to the drawings, reference numerals are used in common for denoting portions throughout the drawings; further, in some drawings, the same hatch pattern is applied to similar portions, and the similar portions are not denoted by reference numerals.

Ahead of description of the present invention, terms used in this specification are briefly explained. First, one of a source and a drain of a transistor is called a drain, and the other is called a source in this specification. That is, they are not distinguished depending on the potential level. Therefore, the source can be alternatively referred to as the drain in this specification.

Further, a voltage refers to a potential difference between a potential and a reference potential (e.g., a source potential, a ground potential) in many cases. Therefore, the voltage can be alternatively referred to a potential. Further, the terms of the potentials, such as "potential VH", "potential VDD", and "potential GND" do not necessarily refer to respective those exact potentials such as a potential VH, a potential VDD, and a potential GND; therefore, the terms can also be read as a potential close to the potential VH, a potential close to the potential VDD, and a potential close to the potential GND, and the like. The term "grounded" is synonymous with being connected to GND.

Further, being "connected" in this specification does not necessarily refer to having a physical connection but may refer to just extending of a wiring in an actual circuit.

The ordinal numbers such as "first" and "second" are used for convenience and denote neither the order of manufacturing steps nor the stacking order of layers. In this specification, the ordinal numbers do not denote particular names which specify the present invention, either.

Further, in this specification, in referring to a specific row, a specific column, or a specific position in a matrix, a reference sign is accompanied by a sign denoting coordinates as follows, for example: "memory cell MC_n_m" or "bit line BL_m". However, in the case where a row, a column, or a position is not specified, the case where elements are collectively referred to, or the case where the position is clearly known, the following expression may be used: "memory cell MC" or "bit line BL", or simply "memory cell" or "bit line".

Embodiment 1

In this embodiment, a semiconductor memory device according to one embodiment of the present invention is described with reference to FIGS. 1A and 1B, FIG. 2, FIGS. 3A to 3D, FIGS. 4A to 4C, and FIGS. 5A to 5C.

Figure 1B:
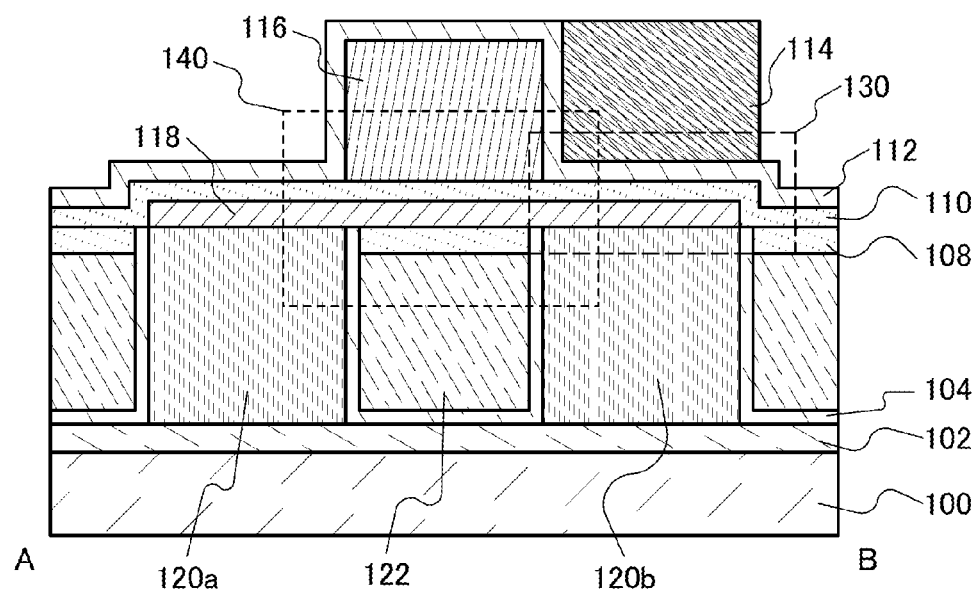

FIGS. 1A and 1B are a top view (see FIG. 1A) and a cross-sectional view (see FIG. 1B) of a memory cell of a DRAM which is the semiconductor memory device.

It is seen from FIG. 1A that the size of the memory cell is 8F² (2F (in length)×4F (in width)).

It is seen from FIG. 1B that the memory cell includes a transistor 140 using an oxide semiconductor film and a capacitor 130.

The memory cell is provided over a base insulating film 102 over a substrate 100. The base insulating film 102 is not necessarily provided, which depends on the top surface condition of the substrate 100.

The transistor 140 includes conductive films 120a and 120b; a first insulating film 104 provided in contact with respective side surfaces of the conductive films 120a and 120b; a first gate electrode 122 which is provided between the conductive films 120a and 120b with the first insulating film 104 provided between the first gate electrode 122 and each of the conductive films 120a and 120b and whose top surface is at a lower level than respective top surfaces of the conductive films 120a and 120b; a first gate insulating film 108 provided over the first gate electrode 122; an oxide semiconductor film 118 provided in contact with the first gate insulating film 108 and the conductive films 120a and 120b; a second gate insulating film 110 provided over the oxide semiconductor film 118; and a second gate electrode 116 provided over the oxide semiconductor film 118 with the second gate insulating film 110 provided therebetween. A second insulating film 112 may be provided to cover the transistor 140.

The capacitor 130 includes the conductive film 120b, the second gate insulating film 110, and an electrode 114. The electrode 114 is shown to be in contact with a side surface of the second insulating film 112; embodiments of the present invention are not limited to this structure. For example, part of the electrode 114 may be overlapped with the second gate electrode 116, or part of the electrode 114 may be overlapped with a conductive film in the same layer as the first gate electrode 122. The conductive film in the same layer as the first gate electrode 122 may be used instead of the electrode 114 for the capacitor, in which case the capacitor 130 can be formed along the side surface of the conductive film 120b; accordingly, the capacitance can be increased as compared to the capacitor using the electrode 114 when the thickness of the conductive film 120b is larger than ⅓ F, where the dielectric layer of the capacitor 130 is the same as each other. Although the thickness is described using F for convenience here, F is just the minimum feature size in the top view and thus it is needless to say that the thickness of the conductive film 120b can be made to be less than F.

In the case where the electrode 114 is used for the capacitor 130, the dielectric layer of the capacitor 130 is a stack of the second gate insulating film 110 and the second insulating film 112. On the other hand, in the case where the conductive film in the same layer as the first gate electrode 122 is used for the capacitor 130, the dielectric layer of the capacitor 130 is the first insulating film 104.

The conductive film 120a functions as a source electrode of the transistor 140. The conductive film 120b functions as a drain electrode of the transistor 140 and one of a pair of electrodes of the capacitor 130.

The first gate electrode 122 functions as a back gate electrode for controlling the threshold voltage of the transistor 140. Further, the conductive film in the same layer as the first gate electrode 122 is provided to surround the memory cell, and thus functions as a guard ring, thereby preventing electrostatic breakdown of the memory cell.

The conductive film 120a of the transistor 140 is connected to a bit line. In this embodiment, the conductive film 120a is extended to form the bit line.

Further, the second gate electrode 116 of the transistor 140 is connected to a word line, though not shown.

The oxide semiconductor film 118 has a thickness greater than or equal to 1 nm and less than or equal to 50 nm, preferably greater than or equal to 3 nm and less than or equal to 20 nm. In particular, when the thickness of the oxide semiconductor film 118 is about 5 nm, where the channel length of the transistor is less than or equal to 30 nm, the change of the threshold voltage can be suppressed and the electrical characteristics can be thereby stabilized.

It is preferable that the oxide semiconductor film 118 contain at least In and Zn. It is preferable that the oxide semiconductor film 118 contain Ga, Sn, Hf, or Al to reduce variation in the electrical characteristics of the transistor, in addition to In and Zn.

It is also preferable that the oxide semiconductor film 118 contain one or more selected from La, Ce, Pr, Nd, Sm, Eu, Gd, Tb, Dy, Ho, Er, Tm, Yb, and Lu, which belong to lanthanoid, to reduce variation in the electrical characteristics of the transistor, in addition to In and Zn.

For the oxide semiconductor film 118, any of the following can be used, for example: a two-component metal oxide such as an In—Zn—O-based material, an Sn—Zn—O-based material, an Al—Zn—O-based material, a Zn—Mg—O-based material, an Sn—Mg—O-based material, an In—Mg—O-based material, or an In—Ga—O-based material; a three-component metal oxide such as an In—Ga—Zn—O-based material, an In—Al—Zn—O-based material, an In—Sn—Zn—O-based material, an Sn—Ga—Zn—O-based material, an Al—Ga—Zn—O-based material, an Sn—Al—Zn—O-based material, an In—Hf—Zn—O-based material, an In—La—Zn—O-based material, an In—Ce—Zn—O-based material, an In—Pr—Zn—O-based material, an In—Nd—Zn—O-based material, an In—Sm—Zn—O-based material, an In—Eu—Zn—O-based material, an In—Gd—Zn—O-based material, an In—Tb—Zn—O-based material, an In—Dy—Zn—O-based material, an In—Ho—Zn—O-based material, an In—Er—Zn—O-based material, an In—Tm—Zn—O-based material, an In—Yb—Zn—O-based material, or an In—Lu—Zn—O-based material; or a four-component metal oxide such as an In—Sn—Ga—Zn—O-based material, an In—Hf—Ga—Zn—O-based material, an In—Al—Ga—Zn—O-based material, an In—Sn—Al—Zn—O-based material, an In—Sn—Hf—Zn—O-based material, or an In—Hf—Al—Zn—O-based material.

For example, the "In—Ga—Zn—O-based material" means an oxide containing In, Ga, and Zn as its main components, in which no particular limitation on the ratio of In:Ga:Zn.

For example, with an In—Sn—Zn—O-based material, high field-effect mobility can be relatively easily realized. Specifically, the field-effect mobility of the transistor can be increased to 31 cm$^2$/Vs or more, 40 cm$^2$/Vs or more, 60 cm$^2$/Vs or more, 80 cm$^2$/Vs or more, or 100 cm$^2$/Vs or more. Further, even with any material (e.g., an In—Ga—Zn—O-based material) other than the In—Sn—Zn—O-based material, the field-effect mobility can be increased by reducing the defect density.

In the case where an In—Zn—O-based material is used for the oxide semiconductor film 118, the atomic ratio of In to Zn is greater than or equal to 0.5 and less than or equal to 50, preferably greater than or equal to 1 and less than or equal to 20, further preferably greater than or equal to 1.5 and less than or equal to 15. When the atomic ratio of Zn is in the above range, the field-effect mobility of the transistor can be increased. It is preferable that the relation of $Z>1.5X+Y$ be satisfied where the atomic ratio of the compound is In:Zn:O=X:Y:Z.

Further, a material represented by $InMO_3(ZnO)_m$ ($m>0$) may be used for the oxide semiconductor film 118. Here, M represents one or more metal elements selected from Zn, Ga, Al, Mn, Sn, Hf, and Co. For example, M may be Ga, Ga and Al, Ga and Mn, Ga and Co, or the like.

As a material of the oxide semiconductor film 118, a material whose band gap is 2.5 eV or more, preferably 2.8 eV or more, further preferably 3.0 eV or more is selected in order to reduce the off-state current of the transistor. Instead of the oxide semiconductor film 118, any other semiconductor material which has a band gap equal to or greater than any of the above-described values may be used.

In the oxide semiconductor film 118, preferably, hydrogen, an alkali metal, an alkaline earth metal, and the like are reduced and the concentration of impurities is very low. If the oxide semiconductor film 118 contains any of the above impurities, recombination in a band gap occurs owing to a level formed by the impurity, increasing the off-state current of the transistor. In addition, it is also preferable that impurities causing carriers directly or indirectly in the oxide semiconductor film, such as a rare gas, nitrogen, phosphorus, or boron, be also reduced.

The concentration of hydrogen in the oxide semiconductor film 118 is, according to secondary ion mass spectrometry (SIMS), less than $5\times10^{19}$ cm$^{-3}$, preferably less than or equal to $5\times10^{18}$ cm$^{-3}$, further preferably less than or equal to $1\times10^{18}$ cm$^{-3}$, still further preferably less than or equal to $5\times10^{17}$ cm$^{-3}$.

Further, the concentrations of alkali metals in the oxide semiconductor film 118 are as follows according to SIMS: the concentration of sodium is less than or equal to $5\times10^{16}$ cm$^{-3}$, preferably less than or equal to $1\times10^{16}$ cm$^{-3}$, further preferably less than or equal to $1\times10^{15}$ cm$^{-3}$; the concentration of lithium is less than or equal to $5\times10^{15}$ cm$^{-3}$, preferably less than or equal to $1\times10^{15}$ cm$^{-3}$; and the concentration of potassium is less than or equal to $5\times10^{15}$ cm$^{-3}$, preferably less than or equal to $1\times10^{15}$ cm$^{-3}$.

By using the oxide semiconductor film 118 described above, the off-state current of the transistor can be reduced. For example, the off-state current of the transistor can be reduced to be less than or equal to $1 \times 10^{-18}$ A, less than or equal to $1 \times 10^{-21}$ A, or less than or equal to $1 \times 10^{-24}$ A when the channel length is 3 μm and the channel width is 1 μm. Therefore, the semiconductor memory device which has excellent data retention characteristics and less power consumption can be manufactured.

The oxide semiconductor film 118 is in a single crystal state, a polycrystalline (also referred to as polycrystal) state, an amorphous state, or the like.

The oxide semiconductor film 118 is preferably a CAAC-OS (c-axis aligned crystalline oxide semiconductor) film.

The CAAC-OS film is not completely single crystal nor completely amorphous. The CAAC-OS film is an oxide semiconductor film with a crystal-amorphous mixed phase structure where crystal parts are included in an amorphous phase. In most cases, the crystal part fits inside a cube whose one side is less than 100 nm. From an observation image with a transmission electron microscope (TEM), a boundary between an amorphous part and a crystal part in the CAAC-OS film is not clear. Further, a grain boundary in the CAAC-OS film is not found with the TEM. Thus, in the CAAC-OS film, a reduction in electron mobility due to the grain boundary is suppressed.

In the crystal part included in the CAAC-OS film, a c-axis is aligned in a direction parallel to a normal vector of a surface where the CAAC-OS film is formed or a normal vector of a top surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. The directions of the a-axis and the b-axis may be different among the crystal parts. In this specification, the term "perpendicular" means a range from 85° to 95°. In addition, the term "parallel" means a range from −5° to 5°.

In the CAAC-OS film, distribution of the crystal parts is not necessarily uniform. For example, in the case where crystal growth occurs from a top surface side of the oxide semiconductor film in the formation process of the CAAC-OS film, the proportion of crystal parts in the vicinity of the top surface of the oxide semiconductor film is higher than that in the vicinity of the surface where the oxide semiconductor film is formed in some cases. Further, by adding an impurity to the CAAC-OS film, the crystal part may be amorphized in a region to which the impurity is added.

Since the c-axes of the crystal parts included in the CAAC-OS film are aligned in the direction parallel to the normal vector of the surface where the CAAC-OS film is formed or the normal vector of the top surface of the CAAC-OS film, the directions of the c-axes may be different from each other depending on the shape of the CAAC-OS film (the cross-sectional shape of the surface where the CAAC-OS film is formed or the cross-sectional shape of the top surface of the CAAC-OS film). The direction of c-axis of the crystal part is the direction parallel to the normal vector of the surface where the CAAC-OS film is formed or the normal vector of the top surface of the CAAC-OS film. The crystal part is formed by film formation or by performing treatment for crystallization such as heat treatment after film formation.

With use of the CAAC-OS film in a transistor, change in electrical characteristics of the transistor due to irradiation with visible light or ultraviolet light can be reduced. Thus, the transistor has high reliability.

Example of a crystal structure of the CAAC-OS film are described in detail with reference to FIGS. 13A to 13E, FIGS. 14A to 14C, and FIGS. 15A to 15C. In FIGS. 13A to 13E, FIGS. 14A to 14C, and FIGS. 15A to 15C, the vertical direction corresponds to a c-axis direction and a plane perpendicular to the c-axis direction corresponds to an a-b plane, unless otherwise specified. The terms "upper half" and "lower half" refer to an upper half above the a-b plane and a lower half below the a-b plane (an upper half and a lower half with respect to the a-b plane), respectively. Furthermore, in FIGS. 13A to 13E, O surrounded by a circle represents a tetracoordinate O atom, and O surrounded by a double circle represents a tricoordinate O atom.

Figure 13A:
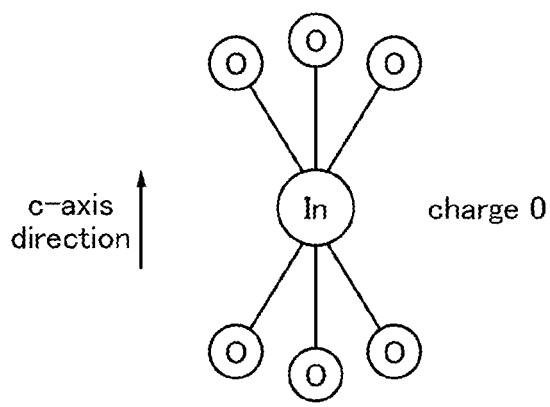
FIGS. 13A to 13E are diagrams each illustrating a crystal structure of an oxide semiconductor according to one embodiment of the present invention.

FIG. 13A illustrates a structure including one hexacoordinate In atom and six tetracoordinate oxygen (hereinafter referred to as tetracoordinate O) atoms proximate to the In atom. Here, a structure including only oxygen atoms proximate to one metal atom is referred to as a small group. The structure in FIG. 13A is actually an octahedral structure, but is illustrated as a planar structure for simplicity. Note that three tetracoordinate O atoms exist in each of an upper half and a lower half in FIG. 13A. Electric charge of the small group illustrated in FIG. 13A is 0.

Figure 13D:
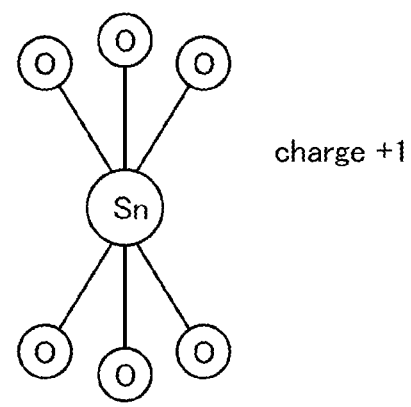
Figure 13B:
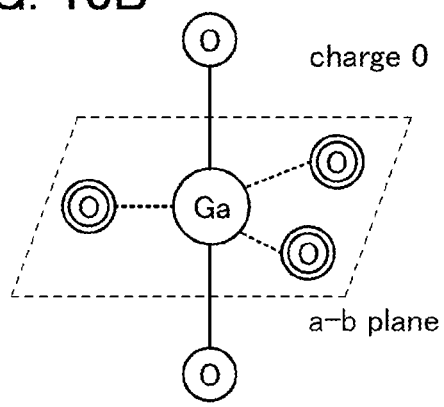

FIG. 13B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 13B. The structure illustrated in FIG. 13B can also be applied to an In atom which can have five ligands. Electric charge of the small group illustrated in FIG. 13B is 0.

Figure 13E:
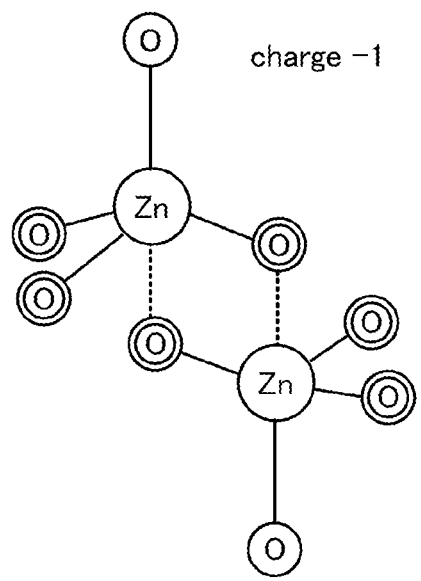
Figure 13C:
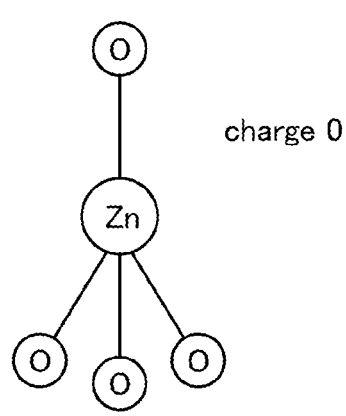

FIG. 13C illustrates a structure including one tetracoordinate Zn atom and four tetracoordinate O atoms proximate to the Zn atom. In FIG. 13C, one tetracoordinate O atom exists in an upper half and three tetracoordinate O atoms exist in a lower half Electric charge of the small group illustrated in FIG. 13C is 0.

FIG. 13D illustrates a structure including one hexacoordinate Sn atom and six tetracoordinate O atoms proximate to the Sn atom. In FIG. 13D, three tetracoordinate O atoms exist in each of an upper half and a lower half Electric charge of the small group illustrated in FIG. 13D is +1.

FIG. 13E illustrates a small group including two Zn atoms. In FIG. 13E, one tetracoordinate O atom exists in each of an upper half and a lower half Electric charge of the small group illustrated in FIG. 13E is −1.

Here, a plurality of small groups is collectively called a medium group, and a plurality of medium groups is collectively called a large group (also referred to as a unit cell).

A rule of bonding between the small groups is described below. The three O atoms in the upper half with respect to the In atom each have three proximate In atoms in the downward direction, and the three O atoms in the lower half each have three proximate In atoms in the upward direction. The one O atom in the upper half with respect to the Ga atom has one proximate Ga atom in the downward direction, and the one O atom in the lower half has one proximate Ga atom in the upward direction. The one O atom in the upper half with respect to the Zn atom has one proximate Zn atom in the downward direction, and the three O atoms in the lower half each have three proximate Zn atoms in the upward direction. Similarly, the number of the tetracoordinate O atoms above the metal atom is equal to the number of the metal atoms proximate to and below each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. The reason is described below. For example, in the case where the hexacoordinate metal (In or Sn) atom is bonded through three tetracoordinate O atoms in the upper half, it is bonded to tetracoordinate O atoms in the upper half of the pentacoordinate metal (Ga or In) atom, tetracoordinate O atoms in the lower half of the pentacoordinate metal (Ga or In) atom, or tetracoordinate O atoms in the upper half of the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 14A:
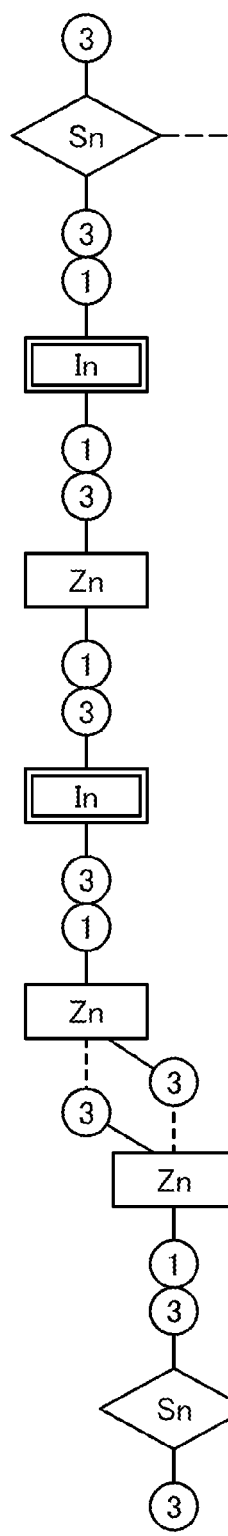
FIGS. 14A to 14C are diagrams illustrating a crystal structure of an oxide semiconductor according to one embodiment of the present invention.
Figure 14B:
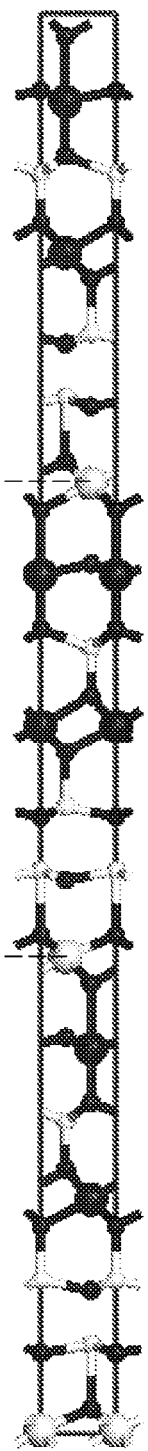
Figure 14C:

FIG. 14A illustrates a model of a medium group for a layered structure of an In—Sn—Zn—O system. FIG. 14B illustrates a large group consisting of three medium groups. FIG. 14C illustrates an atomic arrangement when the layered structure in FIG. 14B is observed from the c-axis direction.

In FIG. 14A, for simplicity, a tricoordinate O atom is omitted and the number of tetracoordinate O atoms is shown. For example, three tetracoordinate O atoms existing in each of an upper half and a lower half with respect to a Sn atom are denoted by circled 3. Similarly, in FIG. 14A, one tetracoordinate O atom existing in each of an upper half and a lower half with respect to an In atom is denoted by circled 1. FIG. 14A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group for the layered structure of the In—Sn—Zn—O system in FIG. 14A, in the order starting from the top, a Sn atom proximate to three tetracoordinate 0 atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge of a small group including a Sn atom is +1. Therefore, electric charge of −1, which cancels +1, is needed to form a layered structure including a Sn atom. As a structure having electric charge of −1, the small group including two Zn atoms as illustrated in FIG. 13E can be given. For example, with one small group including two Zn atoms, electric charge of one small group including a Sn atom can be cancelled, resulting in a total electric charge of the layered structure of 0.

Specifically, the large group illustrated in FIG. 14B is repeated, forming an In—Sn—Zn—O-based crystal ($In_2SnZn_3O_8$). The layered structure of the resulting In—Sn—Zn—O system can be expressed as a composition formula, $In_2SnZn_2O_7(ZnO)_m$ (m is 0 or a natural number).

The above-described rule also applies to the following oxide materials: a four-component metal oxide such as an In—Sn—Ga—Zn—O-based material; a three-component metal oxide such as an In—Ga—Zn—O-based material (also referred to as IGZO), an In—Al—Zn—O-based material, a Sn—Ga—Zn—O-based material, an Al—Ga—Zn—O-based material, a Sn—Al—Zn—O-based material, an In—Hf—Zn—O-based material, an In—La—Zn—O-based material, an In—Ce—Zn—O-based material, an In—Pr—Zn—O-based material, an In—Nd—Zn—O-based material, an In—Sm—Zn—O-based material, an In—Eu—Zn—O-based material, an In—Gd—Zn—O-based material, an In—Tb—Zn—O-based material, an In—Dy—Zn—O-based material, an In—Ho—Zn—O-based material, an In—Er—Zn—O-based material, an In—Tm—Zn—O-based material, an In—Yb—Zn—O-based material, or an In—Lu—Zn—O-based material; a two-component metal oxide material such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; a one-component metal oxide such as In—o-based material, an Sn—O-based material, or a Zn—O-based material; and the like.

For example, FIG. 15A illustrates a model of a medium group for a layered structure of an In—Ga—Zn—O system.

In the medium group for the layered structure of the In—Ga—Zn—O system in FIG. 15A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

FIG. 15B illustrates a large group consisting of three medium groups. FIG. 15C illustrates an atomic arrangement in the case where the layered structure in FIG. 15B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group consisting of a combination of such small groups is always 0.

To form the layered structure of the In—Ga—Zn—O system, a large group can also be formed using a medium group in which the arrangement of the In atom, the Ga atom, and the Zn atom is different from that in FIG. 15A as well as the medium group illustrated in FIG. 15A.

Specifically, the large group illustrated in FIG. 15B is repeated, forming an In—Ga—Zn—O-based crystal. The layered structure of the resulting In—Ga—Zn—O system can be expressed as a composition formula, $InGaO_3(ZnO)_n$ (n is a natural number).

Figure 16A:
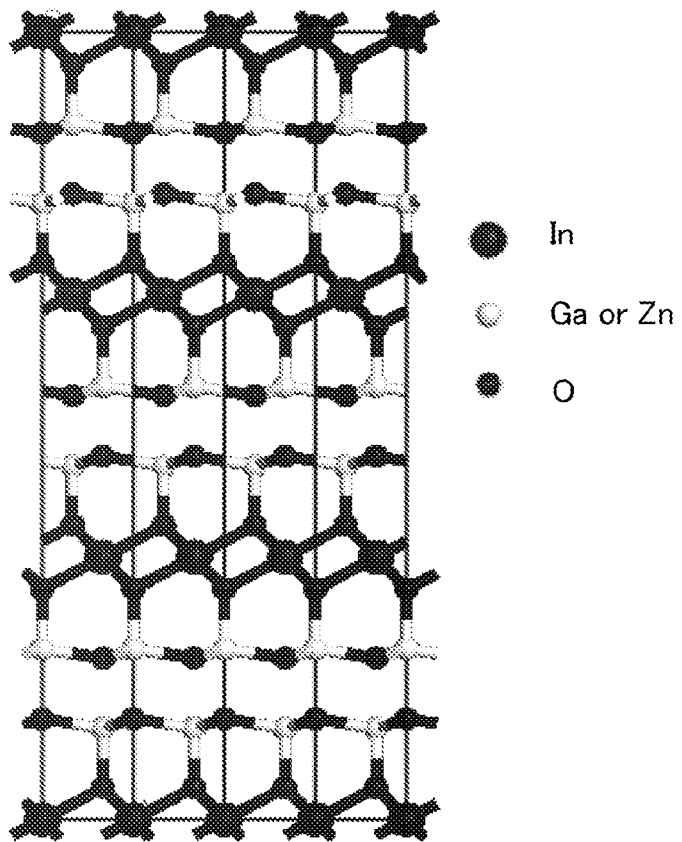
FIGS. 16A and 16B are diagrams each illustrating a crystal structure of an oxide semiconductor according to one embodiment of the present invention.

In the case where n=1 ($InGaZnO_4$), a crystal structure illustrated in FIG. 16A can be formed, for example. In the crystal structure in FIG. 16A, since a Ga atom and an In atom each have five ligands as described in FIG. 13B, Ga can be replaced with In in the structure.

Figure 16B:
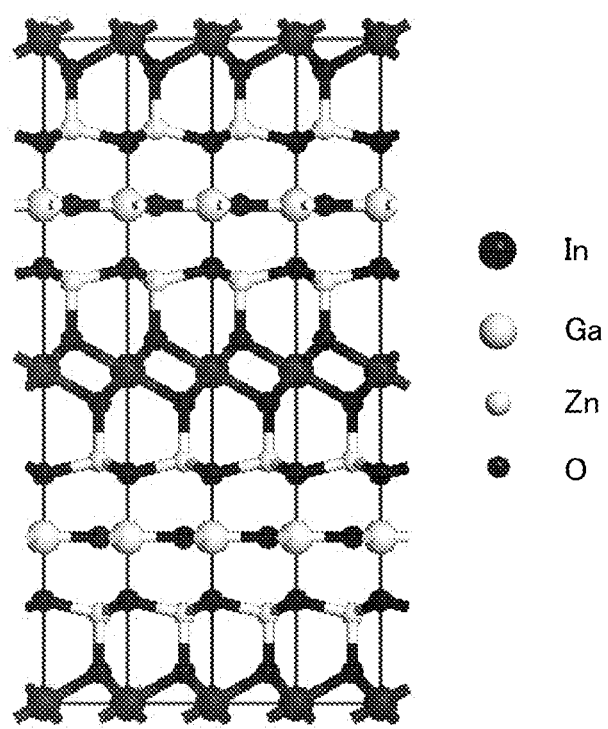

In the case where n=2 ($InGaZn_2O_5$), a crystal structure illustrated in FIG. 16B can be formed, for example. In the crystal structure in FIG. 16B, since a Ga atom and an In atom each have five ligands as described in FIG. 13B, Ga can be replaced with In in the structure.

Hereinafter, a crystal structure of an oxide semiconductor film used in a transistor applicable to the semiconductor memory device which is one embodiment of the present invention is described.

X-ray diffraction (XRD) of the oxide semiconductor film was analyzed for evaluation of the crystal structure. The XRD analysis was conducted by an out-of-plane measurement with an X-ray diffractometer D8 ADVANCE manufactured by Bruker AXS.

Sample A and Sample B were prepared for the XRD analysis. A method for manufacturing Sample A and Sample B is described below.

First, a dehydrogenated quartz substrate was prepared.

Next, an In—Sn—Zn—O film with a thickness of 100 nm was formed over the quartz substrate.

The In—Sn—Zn—O film was formed with a sputtering apparatus with a power of 100 W (DC) in an oxygen atmosphere. An In—Sn—Zn—O target of In:Sn:Zn=1:1:1 [atomic ratio] was used as a target. The substrate heating temperature in film formation was room temperature or 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for 1 hour and heat treatment in an oxygen atmosphere was further performed for 1 hour while keeping the temperature. A sample manufactured in this manner was used as Sample B.

Figure 28:
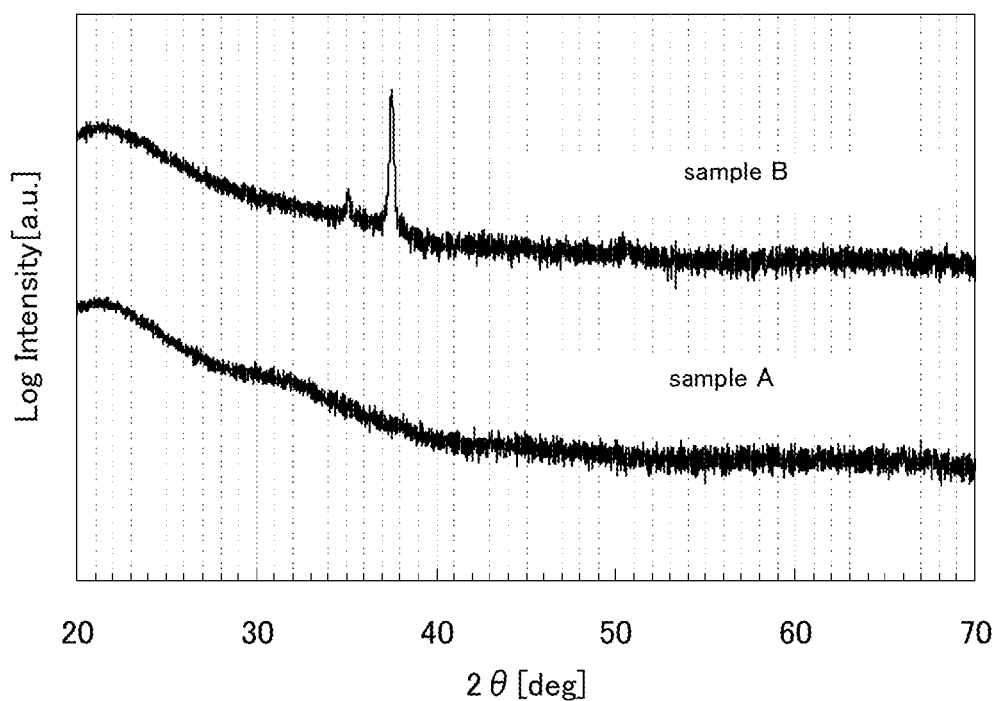
FIG. 28 is a graph showing XRD spectra of an oxide semiconductor film.

FIG. 28 shows XRD spectra of Sample A and Sample B. No peak derived from crystal was observed in Sample A, whereas peaks derived from crystal were observed at 2θ of around 35 deg and 2θ of 37 deg to 38 deg in Sample B.

That is, it is found that a crystalline oxide semiconductor film can be obtained through heat treatment at 650° C. on the sample.

A CAAC-OS film is more likely to be formed when the underlying base film is flat. Specifically, the base film is formed such that the average surface roughness ($R_a$) is less than or equal to 1 nm, preferably less than or equal to 0.3 nm, further preferably less than or equal to 0.1 nm. Note that $R_a$ is obtained by expanding centerline average roughness, which is defined by JIS B 0601, into three dimensions so as to be applicable to a plane, and can be expressed as average value of the absolute values of deviations from a reference surface to a specific surface, which is defined by Expression 1.

$$Ra = \frac{1}{S_0}\int_{y_1}^{y_2}\int_{x_1}^{x_2}|f(x,y)-Z_0|dxdy \quad \text{[Expression 1]}$$

In Expression 1, $S_0$ represents the area of a measurement surface (a quadrangular region which is defined by four points represented by the coordinates $(x_1, y_1)$, $(x_1, y_2)$, $(x_2, y_1)$, and $(x_2, y_2)$), and $Z_0$ represents average height of the measurement surface. The average surface roughness Ra can be measured with an atomic force microscope (AFM).

There is no particular limitation on the substrate 100 as long as it has heat resistance enough to withstand at least heat treatment performed later. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 100. Still alternatively, any of these substrates further provided with a semiconductor element is preferably used as the substrate 100.

Further alternatively, a flexible substrate may be used as the substrate 100. In that case, a transistor is formed directly on the flexible substrate. As a method for forming a transistor over a flexible substrate using as the substrate 100, there is also a method in which a transistor is formed over a non-flexible substrate, and then the transistor is separated from the non-flexible substrate and transferred to the substrate 100. In that case, a separation layer is preferably provided between the non-flexible substrate and the transistor.

A single-layer structure or a stacked-layer structure using at least one of silicon oxide, silicon oxynitride, silicon nitride oxide, silicon nitride, aluminum oxide, aluminum nitride, hafnium oxide, zirconium oxide, yttrium oxide, lanthanum oxide, tantalum oxide, and magnesium oxide may be used to form the base insulating film 102.

Silicon oxynitride refers to a substance that contains more oxygen than nitrogen in composition. For example, silicon oxynitride contains oxygen, nitrogen, silicon, and hydrogen at concentrations of greater than or equal to 50 at. % and less than or equal to 70 at. %, greater than or equal to 0.5 at. % and less than or equal to 15 at. %, greater than or equal to 25 at. % and less than or equal to 35 at. %, and greater than or equal to 0 at. % and less than or equal to 10 at. %, respectively. On the other hand, silicon nitride oxide refers to a substance that contains more nitrogen than oxygen in composition. For example, silicon nitride oxide contains oxygen, nitrogen, silicon, and hydrogen at concentrations of greater than or equal to 5 at. % and less than or equal to 30 at. %, greater than or equal to 20 at. % and less than or equal to 55 at. %, greater than or equal to 25 at. % and less than or equal to 35 at. %, and greater than or equal to 10 at. % and less than or equal to 25 at. %, respectively. The above ranges are ranges according to Rutherford backscattering spectrometry (RBS) and hydrogen forward scattering spectrometry (HFS). Moreover, the total of the percentages of the constituent elements does not exceed 100 at. %.

To form a conductive film forming the conductive films 120a and 120b, a single-layer structure or a stacked-layer structure using at least one of the following materials may be used: Al, Ti, Cr, Co, Ni, Cu, Y, Zr, Mo, Ag, Ta, and W; a nitride of any of these elements; an oxide of any of these elements; and an alloy of any of these elements.

Respective insulating films forming the first insulating film 104, the first gate insulating film 108, the second gate insulating film 110, and the second insulating film 112 may be formed in similar manners using similar materials to the base insulating film 102.

Insulating films from which oxygen is released by heat treatment are preferably used to form the first gate insulating film 108 and the second gate insulating film 110.

In order that crystal growth in the oxide semiconductor film 118 could be more likely to occur, it is preferable that the first gate insulating film 108 be sufficiently flat.

Meaning of "oxygen is released by heat treatment" is to release oxygen at an amount, which is converted to oxygen atoms, of greater than or equal to $1.0 \times 10^{18}$ cm$^{-3}$ or greater than or equal to $1.0 \times 10^{20}$ cm$^{-3}$ according to thermal desorption spectroscopy (TDS) analysis.

A method in which the amount of released oxygen is measured with TDS analysis is described below.

The amount of released gas in TDS analysis is proportional to the integral value of ion intensity. Therefore, the amount of released gas can be calculated from the ratio between the integral value of measured ion intensity and the reference value of a reference sample. The reference value of the reference sample refers to the ratio of the density of a predetermined atom contained in the sample to the integral value of ion intensity for the atom.

For example, the number of released oxygen molecules ($N_{O2}$) from an insulating film can be obtained according to Expression 2 with the TDS analysis results of a silicon wafer containing hydrogen at a predetermined density, which is a reference sample, and the TDS analysis results of the insulating film. Here, all gases having a mass number of 32 which are obtained in the TDS analysis are assumed to originate from an oxygen molecule. Here, CH$_3$OH, which is also a gas having a mass number of 32, is not taken into consideration because it is unlikely to be present. Likewise an oxygen molecule including an oxygen atom having a mass number of 17 or 18 which is an isotope of an oxygen atom is also not taken into consideration because the proportion of such a molecule in nature is minimal $$N_{O2} = \frac{N_{H2}}{S_{H2}} \times S_{O2} \alpha \qquad \text{[Expression 2]}$$

In the Expression, $N_{H2}$ is the value obtained by conversion of the number of hydrogen molecules desorbed from the reference sample into density. In addition, $S_{H2}$ is the integral value of ion intensity when the reference sample is subjected to TDS analysis. Here, the reference value of the reference sample is $N_{H2}/S_{H2}$. Further, $S_{o2}$ is the integral value of ion intensity when the insulating film is subjected to TDS analysis, and α is a coefficient affecting the ion intensity in the TDS analysis. Refer to Japanese Published Patent Application No. H6-275697 for details of Expression 2. The amount of released oxygen from the above insulating film was measured with a thermal desorption spectroscopy apparatus produced by ESCO Ltd., EMD-WA1000S/W and using a silicon wafer containing hydrogen atoms at $1 \times 10^{16}$ cm$^{-3}$ as the reference sample.

Further, in the TDS analysis, part of oxygen is detected in the form of an oxygen atom. The ratio between oxygen molecules and oxygen atoms can be calculated from the ionization rate of the oxygen molecules. Since the above a includes the ionization rate of oxygen molecules, the evaluation of the amount of released oxygen molecules enables the amount of released oxygen atoms to be estimated.

Note that $N_{O2}$ is the number of released oxygen molecules. The amount of released oxygen when converted into oxygen atoms is twice the number of released oxygen molecules.

In the above structure, the film from which oxygen is released by heat treatment may be oxygen-excess silicon oxide (SiO$_X$(X>2)). In the oxygen-excess silicon oxide (SiO$_X$(X>2)), the number of oxygen atoms per unit volume is more than twice the number of silicon atoms per unit volume. The number of silicon atoms and the number of oxygen atoms per unit volume are measured by Rutherford backscattering spectrometry.

Oxygen is supplied to the oxide semiconductor film 118 from the first gate insulating film 108 and the second gate insulating film 110, whereby the interface state densities between the oxide semiconductor film 118 and the first gate insulating film 108 and between the oxide semiconductor film 118 and the second gate insulating film 110 can be decreased. As a result, carrier trapping due to an operation of the transistor or the like at the interface between the oxide semiconductor film 118 and the first gate insulating film 108 or the second gate insulating film 110 can be suppressed; thus, a transistor with less deterioration in electrical characteristics can be obtained.

Further, in some cases, charge is generated attributed to oxygen vacancies in the oxide semiconductor film 118. In general, some of oxygen vacancies in the oxide semiconductor film 118 serve as a donor to release an electron which is a carrier. As a result, the threshold voltage of the transistor shifts in the negative direction. In contrast, oxygen is sufficiently supplied to the oxide semiconductor film 118 from the first gate insulating film 108 and the second gate insulating film 110 preferably such that the oxide semiconductor film 118 contains excess oxygen, thereby reducing oxygen vacancies in the oxide semiconductor film 118 which cause a shift of the threshold voltage in the negative direction.

The second insulating film 112 is formed using a material whose oxygen diffusion coefficient is smaller than either one of those of the first gate insulating film 108 and the second gate insulating film 110 at temperatures higher than or equal to 250° C. and lower than or equal to 450° C. For example, in the case where the first gate insulating film 108 and the second gate insulating film 110 are oxide silicon films from which oxygen is released by heat treatment, an aluminum oxide film may be used as the second insulating film 112. With the second insulating film 112 having such characteristics, outward diffusion of oxygen from the transistor 140 can be prevented.

Respective conductive films forming the first gate electrode 122, the second gate electrode 116, and the electrode 114 may be formed in similar manners using similar materials to the conductive film forming the conductive films 120a and 120b. Alternatively, an oxide or an oxynitride containing at least In and Zn may be used. For example, In—Ga—Zn—O—N-based material may be used.

The field-effect mobility of the transistor is described with reference to FIG. 17, FIGS. 18A to 18C, FIGS. 19A to 19C, and FIGS. 20A to 20C. For easy understanding, a structure of the transistor used for description is different from that of a structure of the transistor according to one embodiment of the present invention.

The field-effect mobility of a transistor tends to be measured lower than its inherent field-effect mobility for a variety of reasons; this phenomenon occurs not only in the case of using an oxide semiconductor. One of the causes for a reduction in the field-effect mobility is a defect inside a semiconductor or a defect at an interface between the semiconductor and an insulating film. Here, the field-effect mobility on the assumption that no defect exists inside the semiconductor is calculated theoretically by using a Levinson model.

Assuming that the inherent field-effect mobility of the transistor is $\mu_0$ and a potential barrier (such as a grain boundary) exists in the semiconductor, the measured field-effect mobility μ is expressed by Expression 3.

$$\mu = \mu_0 \exp\left(-\frac{E}{kT}\right) \qquad \text{[Expression 3]}$$

Here, E represents the height of the potential barrier, k represents the Boltzmann constant, and T represents the absolute temperature. According to the Levinson model, the height of the potential barrier E is assumed to be attributed to a defect and is expressed by Expression 4.

$$E = \frac{e^2 N^2}{8\varepsilon n} = \frac{e^3 N^2 t}{8\varepsilon C_{ox} V_{gs}}$$ [Expression 4]

In the expression, e represents the elementary charge, N represents the average defect density per unit area of a channel, $\varepsilon$ represents the dielectric constant of the semiconductor, n represents the carrier density per unit area of the channel, $C_{ox}$ represents the capacitance of the gate insulating film per unit area, $V_{gs}$ represents the gate voltage, and t represents the thickness of the channel. In the case where the thickness of the semiconductor layer is 30 nm or less, the thickness of the channel can be regarded as being the same as the thickness of the semiconductor layer.

The drain current $I_{ds}$ in a linear region is expressed by Expression 5.

$$\frac{I_{ds}}{V_{gs}} = \frac{W \mu V_{ds} C_{ox}}{L} \exp\left(-\frac{E}{kT}\right)$$ [Expression 5]

In the formula, L represents the channel length and W represents the channel width, and L and W are each set at 10 µm. In addition, $V_{ds}$ represents the drain voltage.

When taking logarithms of both sides of Expression 5, Expression 6 can be obtained.

$$\ln\left(\frac{I_{ds}}{V_{gs}}\right) = \ln\left(\frac{W \mu W_{ds} C_{ox}}{L}\right) - \frac{E}{kT} = \ln\left(\frac{W \mu V_{ds} C_{ox}}{L}\right) - \frac{e^3 N^2 t}{8 k T \varepsilon C_{ox} V_{gs}}$$ [Expression 6]

Since the right side of Expression 6 is a function of $V_{gs}$, the defect density N can be obtained from the slope of a line showing a relation between $\ln(I_{ds}/V_{gs})$ indicated in the ordinate and $1/V_{gs}$ indicated in the abscissa. That is, the defect density N in the semiconductor can be obtained from the $V_{gs}$-$I_{ds}$ characteristics of the transistor.

Defect density N in a semiconductor depends on a substrate temperature in the formation of the semiconductor. In the case where the semiconductor is an oxide semiconductor deposited using an In—Sn—Zn—O target of In:Sn:Zn=1:1:1 [atomic ratio], the defect density N in the oxide semiconductor is approximately $1 \times 10^{12}/cm^2$.

Calculating with Expressions 3 and 4 on the basis of the above defect density N in the oxide semiconductor, the inherent field-effect mobility $\mu_0$ of the transistor comes to be 120 cm²/Vs. Thus, in an ideal transistor in which no defect exists inside the oxide semiconductor and at the interface between the oxide semiconductor and the gate insulating film that is in contact with the oxide semiconductor, the field-effect mobility $\mu_0$ is found to be 120 cm²/Vs. By contrast, in the case of using an oxide semiconductor with many defects, the field-effect mobility $\mu$ of a transistor is approximately 30 cm²/Vs.

Further, even when no defect exists inside the semiconductor, scattering at an interface between the channel and the gate insulating film adversely affects the transport properties of the transistor. The field-effect mobility $\mu_1$ at a position that is distance x away from the interface between the channel and the gate insulating film is expressed by Expression 7.

$$\frac{1}{\mu_1} = \frac{1}{\mu_0} + \frac{D}{B} \exp\left(-\frac{x}{l}\right)$$ [Expression 7]

Here, D represents the electric field intensity by the gate electrode, B represents a constant, and l represents the depth at which the adverse effect of scattering at the interface is caused. Values of B and l can be obtained from actual measurement of the electrical characteristics of the transistor; according to actual measurement of the electrical characteristics of the transistor including the above oxide semiconductor, B is $4.75 \times 10^7$ cm/s and l is 10 nm. As D is increased, i.e., as $V_{gs}$ is increased, the second term of Expression 7 increases and accordingly the field-effect mobility $\mu_1$ decreases.

Figure 17:
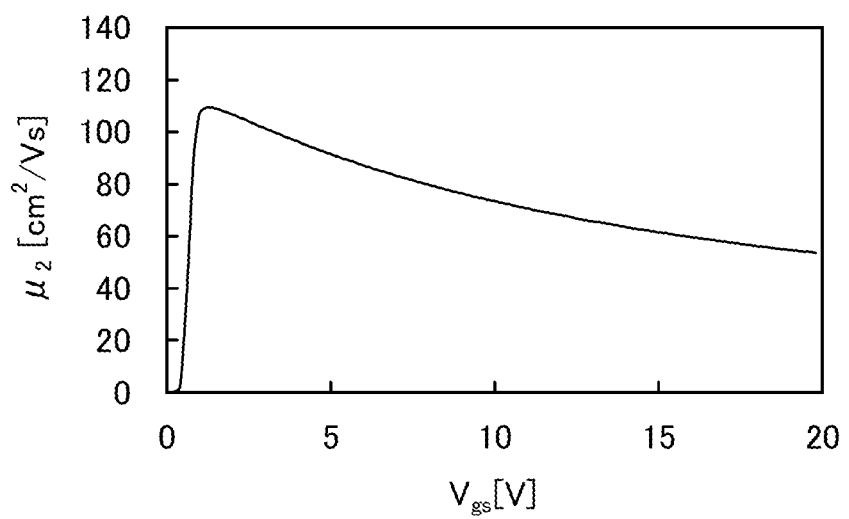
FIG. 17 is a graph showing the gate-source voltage ($V_{gs}$) dependence of the field-effect mobility according to calculation.

FIG. 17 shows calculation results of the field-effect mobility $\mu_2$ of an ideal transistor in which no defect exists inside an oxide semiconductor and at an interface between the oxide semiconductor and a gate insulating film that is in contact with the oxide semiconductor. For the calculation, Sentaurus Device manufactured by Synopsys, Inc. was used, and the band gap, the electron affinity, the relative permittivity, and the thickness of the oxide semiconductor were set at 2.8 eV, 4.7 eV, 15, and 15 nm, respectively. Further, the work function of a gate of the transistor was set at 5.5 eV and that of each of a source and a drain of the transistor was set at 4.6 eV. The thickness of the gate insulating film was set at 100 nm, and the relative permittivity thereof was set at 4.1. The channel length and the channel width were each set at 10 µm and $V_{ds}$ was set at 0.1 V.

As shown in FIG. 17, the field-effect mobility $\mu_2$ has a peak of 100 cm²/Vs or more at $V_{gs}$ of around 1 V, and then decreases as $V_{gs}$ becomes higher because the influence of interface scattering increases.

Calculation results in the case where such an ideal transistor is miniaturized are shown in FIGS. 18A to 18C, FIGS. 19A to 19C, and FIGS. 20A to 20C. Note that in the calculation, transistors having structures illustrated in FIGS. 21A and 21B was used.

Figure 21A:
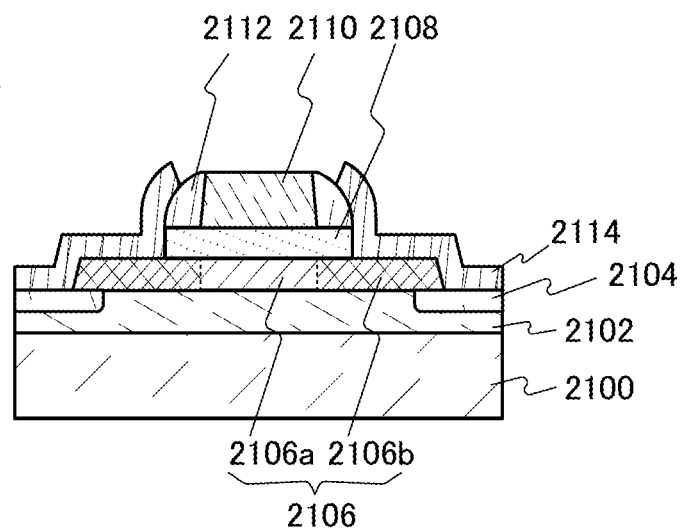
FIGS. 21A and 21B are cross-sectional views showing structures of transistors used for calculation.

The transistor illustrated in FIG. 21A includes a substrate 2100; a base insulating film 2102 provided over the substrate 2100; a protective insulating film 2104 provided in the periphery of the base insulating film 2102; an oxide semiconductor film 2106 which is provided over the base insulating film 2102 and the protective insulating film 2104 and includes a high-resistance region 2106a and a low-resistance region 2106b; a gate insulating film 2108 provided over the oxide semiconductor film 2106; a gate electrode 2110 provided to overlap with the oxide semiconductor film 2106 with the gate insulating film 2108 provided therebetween; a sidewall insulating film 2112 provided in contact with a side surface of the gate electrode 2110; and a pair of electrodes 2114 provided in contact with at least the oxide semiconductor film 2106.

Here, the resistivity of the low-resistance region 2106b was assumed to be $2 \times 10^{-3}$ Ωcm, and the width of the gate electrode 2110, that of the sidewall insulating film 2112, and the channel width were assumed to be 33 nm, 5 nm, and 40 nm, respectively. The channel region is referred to as the high-resistance region 2106a for convenience, but the channel region was assumed to be an intrinsic semiconductor here.

Figure 18A:
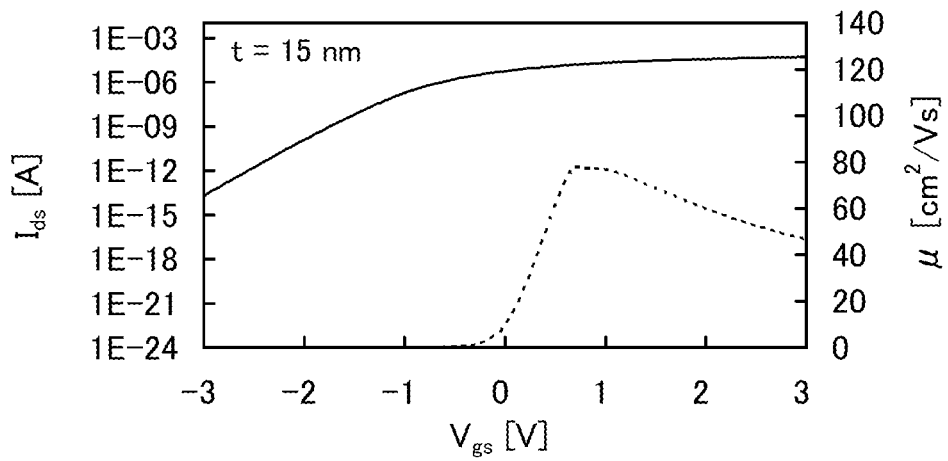
FIGS. 18A to 18C are graphs each showing the gate-source voltage ($V_{gs}$) dependence of the drain-source current ($I_{ds}$) and the field-effect mobility according to calculation.
Figure 18B:
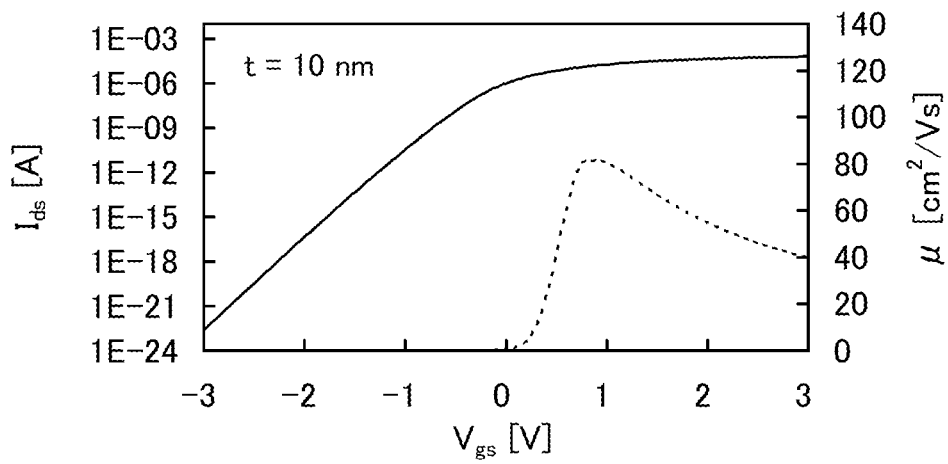
Figure 18C:
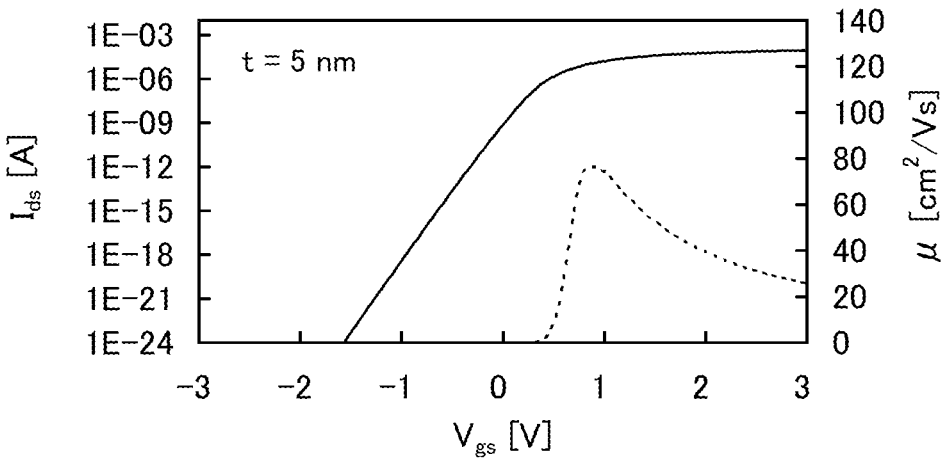

For the calculation, Sentaurus Device manufactured by Synopsys, Inc. was used. FIGS. 18A to 18C show $V_{gs}$ dependence of $I_{ds}$ (solid line) and the field-effect mobility µ (dotted line) of the transistor having the structure illustrated in FIG. 21A. Note that $I_{ds}$ was obtained in the condition in which $V_{ds}$ was 1 V and the field-effect mobility μ was obtained in the condition in which $V_{ds}$ was 0.1 V. FIG. 18A shows the results where the thickness of the gate insulating film was 15 nm, FIG. 18B shows the results where the thickness of the gate insulating film was 10 nm, and FIG. 18C shows the results where the thickness of the gate insulating film was 5 nm.

FIGS. 18A to 18C show that as the gate insulating film is thinner, the drain current $I_{ds}$ in an off state (here, in the range of $V_{gs}$ from −3 V to 0 V) decreases. On the other hand, there is no noticeable change in the peak value of the field-effect mobility μ and the drain current $I_{ds}$ in an on state (here, in the range of $V_{gs}$ from 0 V to 3 V). FIGS. 18A to 18C also show that $I_{ds}$ exceeds 10 μA, which is requisite for a memory and the like that are semiconductor devices, at $V_{gs}$ of around 1 V.

Figure 21B:
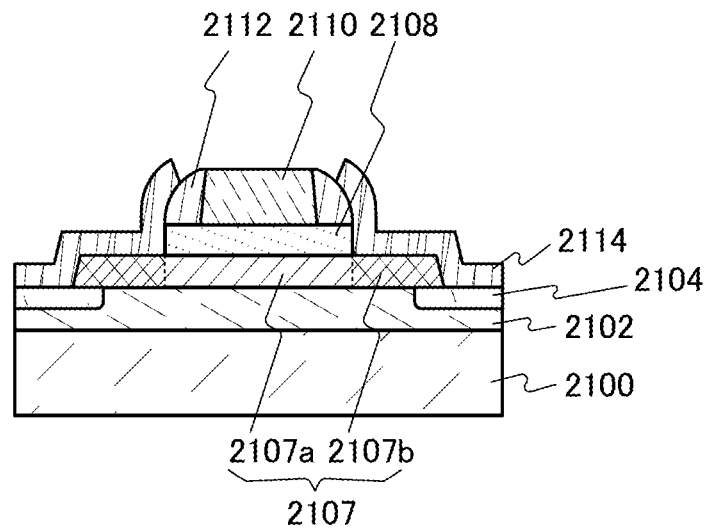

Similarly, the calculation was also conducted on the transistor illustrated in FIG. 21. The transistor illustrated in FIG. 21B is different from the transistor illustrated in FIG. 21A in that an oxide semiconductor film 2107 including a high-resistance region 2107a and a low-resistance region 2107b is provided. Specifically, in the transistor illustrated in FIG. 21B, a region of the oxide semiconductor film 2107 which overlaps with the sidewall insulating film 2112 is included in the high-resistance region 2107a. The transistor is, in other words, a transistor having an offset region whose width is the same as the width of the sidewall insulating film 2112. Note that the width of the offset region is also referred to as an offset length ($L_{off}$).

Figure 19A:
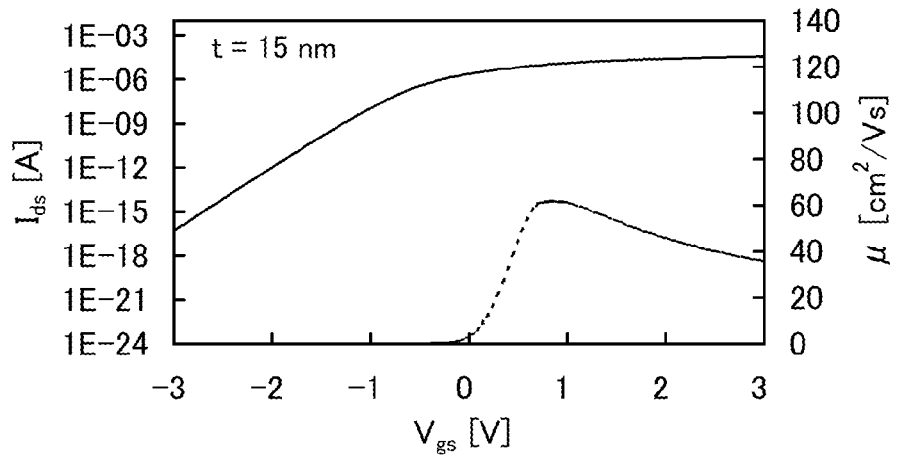
FIGS. 19A to 19C are graphs each showing the gate-source voltage ($V_{gs}$) dependence of the drain-source current ($I_{ds}$) and the field-effect mobility according to calculation.
Figure 19B:
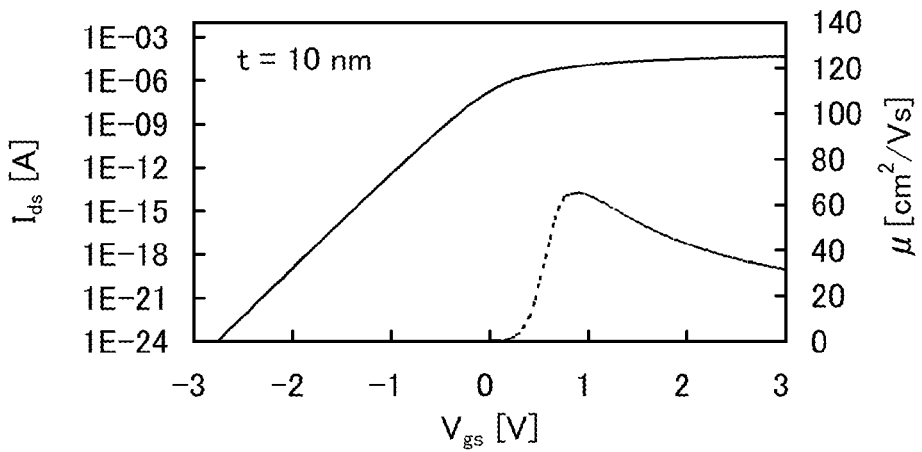
Figure 19C:
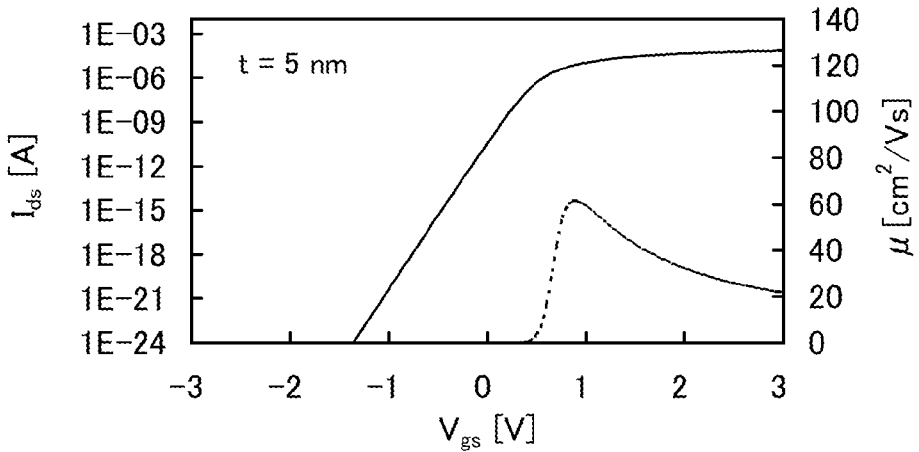

FIGS. 19A to 19C show $V_{gs}$ dependence of the drain current $I_{ds}$ (solid line) and the field-effect mobility μ (dotted line) of the transistor illustrated in FIG. 21B in which $L_{off}$ is 5 nm. Note that $I_{ds}$ was calculated at $V_{ds}$ of 1 V and the field-effect mobility μ was calculated at $V_{ds}$ of 0.1 V. FIG. 19A shows the results where the thickness of the gate insulating film was 15 nm, FIG. 19B shows the results where the thickness of the gate insulating film was 10 nm, and FIG. 19C shows the results where the thickness of the gate insulating film was 5 nm.

Figure 20A:
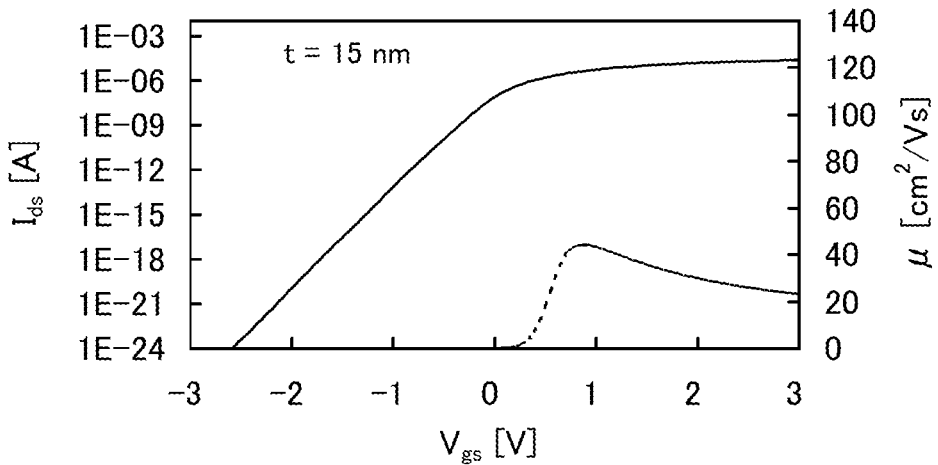
FIGS. 20A to 20C are graphs each showing the gate-source voltage ($V_{gs}$) dependence of the drain-source current ($I_{ds}$) and the field-effect mobility according to calculation.
Figure 20B:
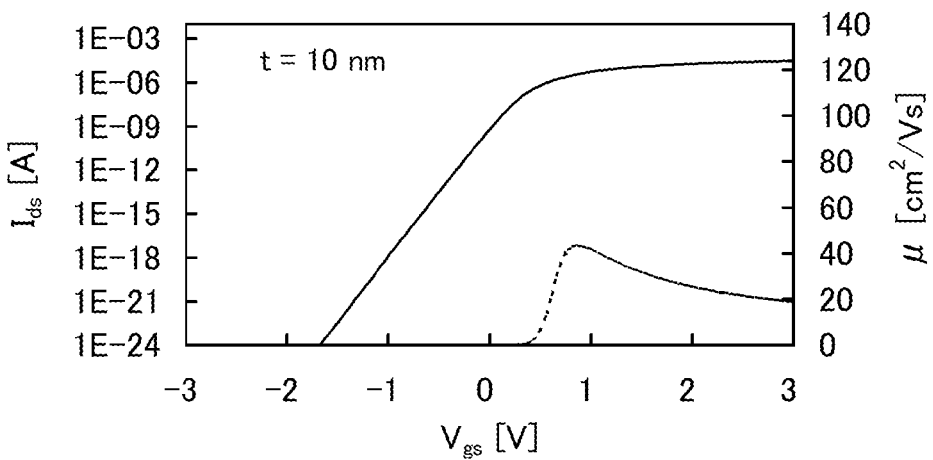
Figure 20C:
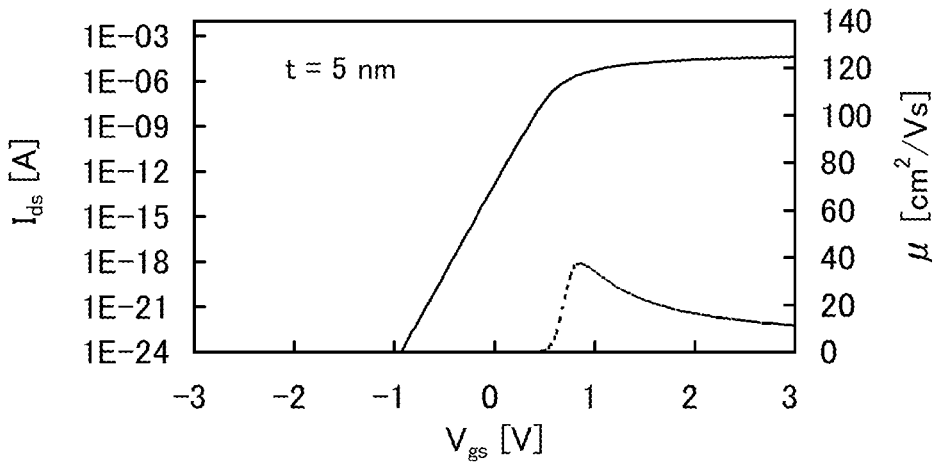

FIGS. 20A to 20C show $V_{gs}$ dependence of the drain current $I_{ds}$ (solid line) and the field-effect mobility μ (dotted line) of the transistor illustrated in FIG. 21B in which $L_{off}$ is 15 nm. Note that $I_{ds}$ was calculated at $V_{ds}$ of 1 V and the field-effect mobility μ was calculated at $V_{ds}$ of 0.1 V. FIG. 20A shows the results where the thickness of the gate insulating film was 15 nm, FIG. 20B shows the results where the thickness of the gate insulating film was 10 nm, and FIG. 20C shows the results where the thickness of the gate insulating film was 5 nm.

Both the calculation results in FIGS. 19A to 19C and those in FIGS. 20A to 20C reveals that similarly to FIGS. 18A to 18C, as the gate insulating film is thinner, the drain current $I_{ds}$ in an off state (here, in the range of $V_{gs}$ from −3 V to 0 V) decreases. On the other hand, it is also shown that there is no noticeable change in the peak value of the field-effect mobility μ and the drain current $I_{ds}$ in an on state (here, in the range of $V_{gs}$ from 0 V to 3 V).

Note that the peak of the field-effect mobility μ is approximately 80 cm²/Vs in FIGS. 18A to 18C, approximately 60 cm²/Vs in FIGS. 19A to 19C, and approximately 40 cm²/Vs in FIGS. 20A to 20C; thus, the peak of the field-effect mobility μ decreases as the offset length $L_{off}$ is increased. Further, it is found that the same applies to $I_{ds}$ in the off state. The drain current $I_{ds}$ in an on state also decreases as the offset length $L_{off}$ is increased, which is, however, much more gradual than the decrease in $I_{ds}$ in the off-state current. Any calculation result shows that $I_{ds}$ exceeds 10 μA, which is requisite for a memory and the like, at $V_{gs}$ of around 1 V.

Next, a circuit diagram of a memory cell array in which the plurality of memory cells each described in FIGS. 1A and 1B is described with reference to FIG. 2.

The memory cell array includes a word line WL, a bit line BL, a back gate line BGL, and a memory cell MC.

In the memory cell MC, a gate of the transistor 140 is connected to the word line WL, a source of the transistor 140 is connected to the bit line BL, and a back gate of the transistor 140 is connected to the back gate line BGL. One of a pair of electrodes of the capacitor 130 is connected to a drain of the transistor 140, and the other of the electrodes of the capacitor 130 is grounded. The other of the electrodes of the capacitor 130 is not necessarily grounded, but may be connected to the back gate line BGL.

Here, the gate of the transistor 140 is the second gate electrode 116, the source of the transistor 140 is the conductive film 120a, the drain of the transistor 140 is the conductive film 120b, and the back gate of the transistor 140 is the first gate electrode 122.

The back gate line BGL may be connected to a switching element and a capacitor. In that case, a potential is applied to the back gate line BGL through the switching element. The potential is held in the capacitor by turning off the switching element. It is preferable that the switching element be normally off; accordingly, the potential can be kept being held even after power is stopped being supplied to the switching element. For example, a transistor similar to the transistor 140 may be used as the switching element.

Here, "normally off" refers to being in an off state when a power supply potential is not applied.

By providing the back gate line BGL in this manner, the threshold voltage of the transistor 140 can be controlled. For example, a negative voltage (potential lower than the source potential of the transistor 140) may be applied to the back gate line BGL to shift the threshold voltage of the transistor 140 in the positive direction, whereby the transistor 140 can be off with certainly at a gate voltage of 0 V (when power is not supplied). Accordingly, data of the memory cell MC can be retained for a long period of time even while power is not supplied.

Next, a method of writing data to the memory cell array shown in FIG. 2 and a method of reading data therefrom are described.

Data writing to the memory cell array is performed per memory cell MC or per row.

First, a method of writing data per memory cell MC is described. For example, to write data 1 to a memory cell MC at the 1st row at the 1st column, a potential VH is applied to a word line WL at the 1st row, and then a potential VDD is applied to a bit line BL at the 1st column. On the other hand, to write data 0 to the memory cell MC at the 1st row at the 1st column, the potential VH is applied to the word line WL at the 1st row, and then a potential GND is applied to the bit line BL at the 1st column. Then, the potential of the word line WL is changed to GND (or a potential lower than GND), whereby data is held in the capacitor 130. By performing the above-described operation on all of the memory cells MC, data can be written to the memory cell array. That said, data written to the memory cell MC before is lost by writing data to another memory cell MC at the same row; to recover that loss, a circuit for holding data written once before is provided, with which data writing is repeated on each memory cell MC every data writing until data writing to all of the memory cells MC at the same row is terminated.

Alternatively, data writing is performed per row. For example, to write data to the memory cells at the 1st row, the potential VH is applied to the word line WL at the 1st row, and then, the potential VDD is applied to the bit line BL at each column of the memory cell(s) to which data 1 is written, whereas the potential GND is applied to the bit line BL at each column of the memory cell(s) to which data 0 is written. Then, the potential of the word line WL is changed to GND (or a potential lower than GND), whereby data is held in the capacitor 130. By performing the above-described operation on all of the rows, data can be written to all of the memory cells.

Next, a method of reading data is described.

First, a method of reading data per memory cell MC is described. For example, to read data of the memory cell MC at the 1st row at the 1st column, the bit line BL at the 1st column is set at a predetermined potential (certain potential), and then, the potential VH is applied to the word line WL at the 1st row. Consequently, the potential of the bit line BL at the 1st column is changed in accordance with data held in the memory cell MC and then read out by a sense amplifier (not shown). By performing the above-described operation on all of the memory cells MC, data can be read from all of the memory cells. In that case, data in the memory cell MC is lost by reading data from another memory cell MC at the same row; to recover that loss, a circuit for holding data written once before is provided, with which data writing is repeated on each memory cell MC before data in the memory cell MC is read every data reading until data reading from all of the memory cells MC at the same row is terminated.

Alternatively, data reading is performed per row. For example, to read data from the memory cells at the 1st row, all of the bit lines BL are set at a predetermined potential (certain potential), and then, the potential VH is applied to the word line WL at the 1st row, so that the potential of each bit line BL is changed in accordance with data. By performing the above-described operation on all of the rows, data can be read from all of the memory cells.

The methods of writing and reading data to/from the memory cell array are described above.

A method for forming the memory cell shown in FIGS. 1A and 1B is described with reference to FIGS. 3A to 3D, FIGS. 4A to 4C, and FIGS. 5A to 5C.

Figure 3A:
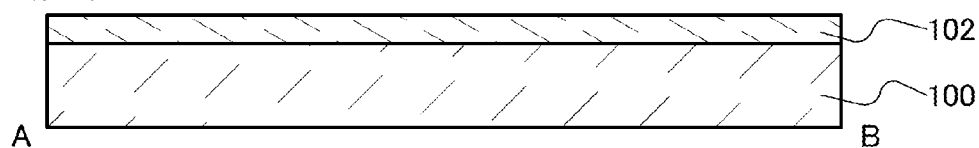
FIGS. 3A to 3D are cross-sectional views illustrating a manufacturing method of the semiconductor memory device shown in FIGS. 1A and 1B.
Figure 3B:
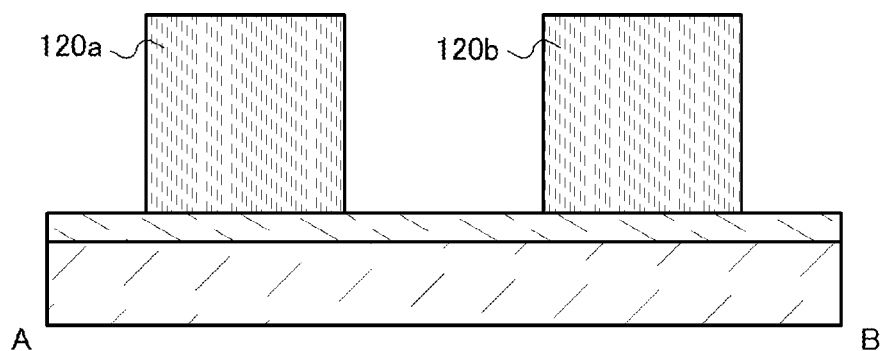

First, the base insulating film 102 is formed over the substrate 100 by a sputtering method, an evaporation method, a plasma chemical vapor deposition method (PCVD method), a pulsed laser deposition method (PLD method), an atomic layer deposition method (ALD method), a molecular beam epitaxy method (MBE method), or the like (see FIG. 3A).

Next, a conductive film is formed by a sputtering method, an evaporation method, a PCVD method, a PLD method, an ALD method, an MBE method, or the like. Then, the conductive film is processed by a photolithography process, so that the conductive films 120a and 120b are formed (see FIG. 3B).

Figure 3C:
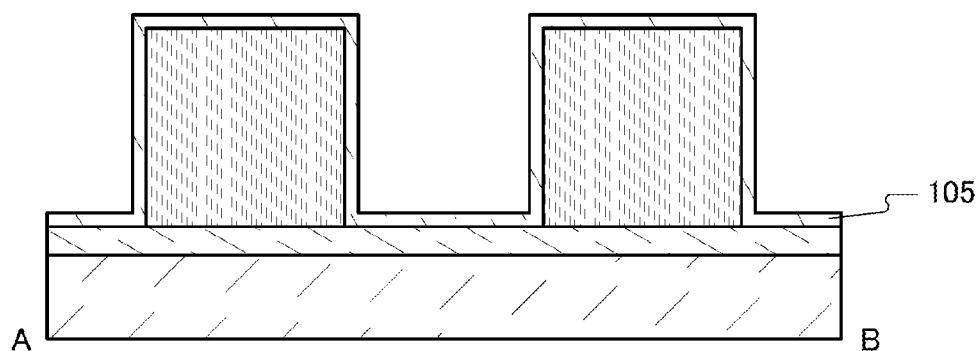

Next, a first insulating film 105 is formed by a sputtering method, an evaporation method, a PCVD method, a PLD method, an ALD method, an MBE method, or the like (see FIG. 3C).

Figure 3D:
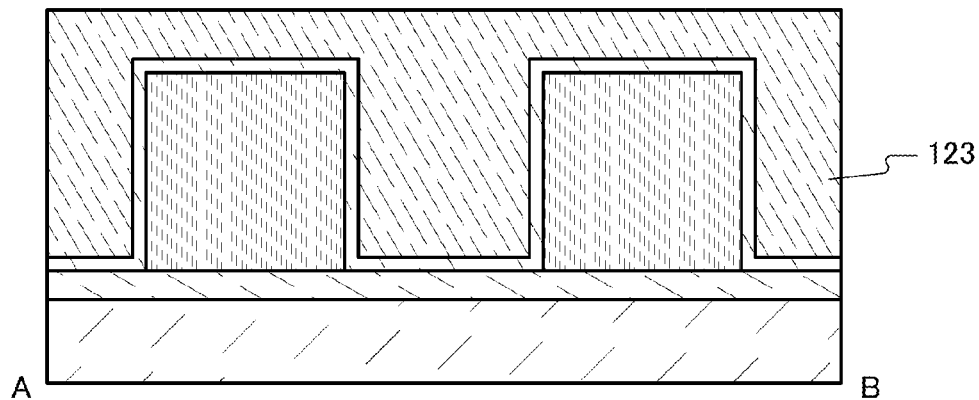

Next, a conductive film 123 is formed to bury steps formed by the conductive films 120a and 120b (see FIG. 3D). The conductive film 123 may be formed, for example, by forming a conductive film by a sputtering method, an evaporation method, a PCVD method, a PLD method, an ALD method, an MBE method, or the like and then planarizing the conductive film by CMP or the like; or by a known reflow technology or a known planarization film forming method (e.g., bias sputtering method).

Figure 4A:
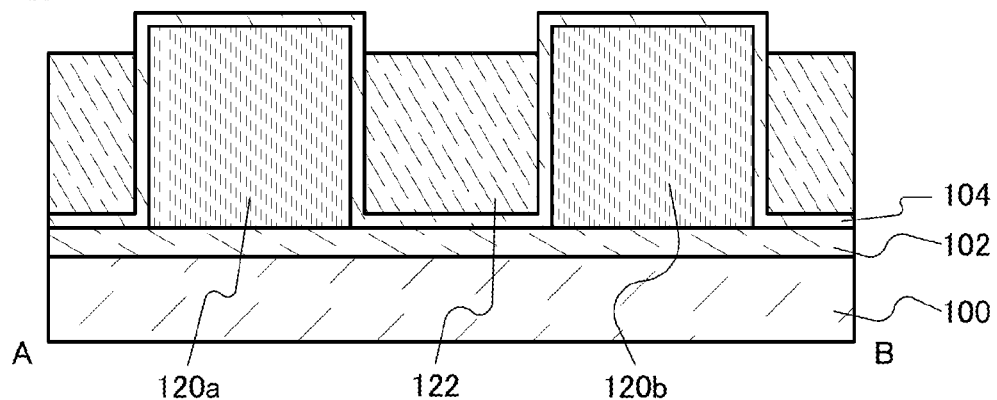
FIGS. 4A to 4C are cross-sectional views illustrating a manufacturing method of the semiconductor memory device shown in FIGS. 1A and 1B.

Then, the conductive film 123 is selectively removed by etching such that the top surface is at a lower level than respective top surfaces of the conductive films 120a and 120b, so that the first gate electrode 122 is formed (see FIG. 4A).

Figure 4B:
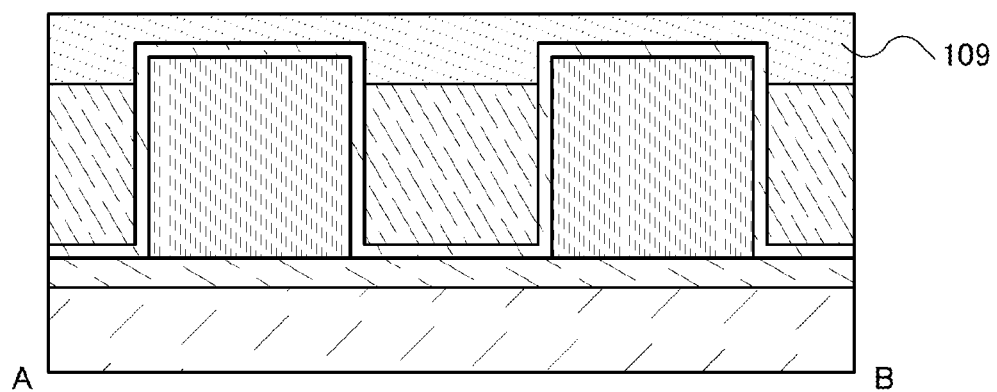

Next, an insulating film 109 is formed to bury steps formed by the conductive films 120a and 120b (see FIG. 4B). The insulating film 109 may be formed, for example, by forming an insulating film by a sputtering method, an evaporation method, a PCVD method, a PLD method, an ALD method, an MBE method, or the like and then planarizing the insulating film by CMP or the like; or by a known planarization film forming method.

Figure 4C:
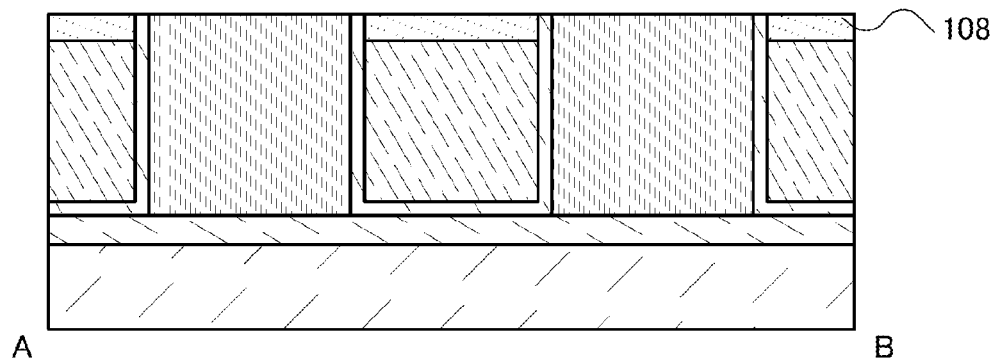

Next, the insulating film 109 is processed by CMP, so that the first gate insulating film 108 is formed (see FIG. 4C). The insulating film 109 may be processed by a dry-etching method instead of CMP. Further, although respective top surfaces of the first gate insulating film 108 and the conductive films 120a and 120b are at the same level in FIG. 4C, embodiments of the present invention are not limited to this structure. For example, one of the top surfaces of the first gate insulating film 108 and the conductive film 120a, 120b may be at a higher level.

Next, an oxide semiconductor film is formed by a sputtering method, an evaporation method, a PCVD method, a PLD method, an ALD method, an MBE method, or the like.

The oxide semiconductor film is formed by, preferably, a sputtering method in an oxygen gas atmosphere at a substrate heating temperature higher than or equal to 100° C. and lower than or equal to 600° C., preferably higher than or equal to 150° C. and lower than or equal to 550° C., further preferably higher than or equal to 200° C. and lower than or equal to 500° C. The thickness of the oxide semiconductor film is greater than or equal to 1 nm and less than or equal to 50 nm, preferably greater than or equal to 3 nm and less than or equal to 20 nm. The higher the substrate heating temperature in the film formation is, the lower the impurity concentration of the obtained oxide semiconductor film is, and the more the atomic arrangement in the oxide semiconductor film is ordered, and the higher the film density is, so that a polycrystalline film or a CAAC-OS film is more likely to be formed. Further, a CAAC-OS film is more likely to be formed by film formation in an oxygen gas atmosphere because an unnecessary atom such as a rare gas does not enter the film. However, a mixed gas atmosphere of an oxygen gas and a rare gas may be used, in which case, the percentage of the oxygen gas is higher than or equal to 30 vol. %, preferably higher than or equal to 50 vol. %, further preferably higher than or equal to 80 vol. %. Thinner the oxide semiconductor film is, less the short channel effect of the transistor is. However, when the oxide semiconductor film is too thin, the effect of interface scattering is intensified, which may lead to a reduction in field-effect mobility.

In the case of depositing an In—Sn—Zn—O-based material as the oxide semiconductor film by a sputtering method, it is preferable to use an In—Sn—Zn—O target having an atomic ratio of In:Sn:Zn=2:1:3, 1:2:2, 1:1:1, or 20:45:35. With the In—Sn—Zn—O target having the above-described atomic ratio, a polycrystalline film or a CAAC-OS film is more likely to be formed as the oxide semiconductor film.

Next, a first heat treatment is performed thereon. The first heat treatment is performed in a reduced pressure atmosphere, an inert atmosphere, or an oxidizing atmosphere. By the first heat treatment, the impurity concentration in the oxide semiconductor film can be reduced.

The first heat treatment is preferably performed in such a manner that heat treatment in a reduced pressure atmosphere or an inert gas atmosphere is performed and then, the atmosphere is changed to an oxidizing atmosphere while the temperature is kept, and the heat treatment is further performed. The heat treatment in a reduced pressure atmosphere or an inert atmosphere can effectively reduce the impurity concentration in the oxide semiconductor film, but also leads to generation of oxygen vacancies. Those oxygen vacancies can be reduced by the heat treatment in an oxidizing atmosphere.

The impurity level in the oxide semiconductor film can be significantly reduced by the first heat treatment in addition to the substrate heating in the film formation. Accordingly, the field-effect mobility of the transistor can be increased to be close to an ideal field-effect mobility described later.

An oxygen ion may be added into the oxide semiconductor film and impurities such as hydrogen may be eliminated from the oxide semiconductor film by performing heat treatment. Further, the oxide semiconductor film may be crystallized by the heat treatment or the subsequent heat treatment (such as the first heat treatment).

Figure 5A:
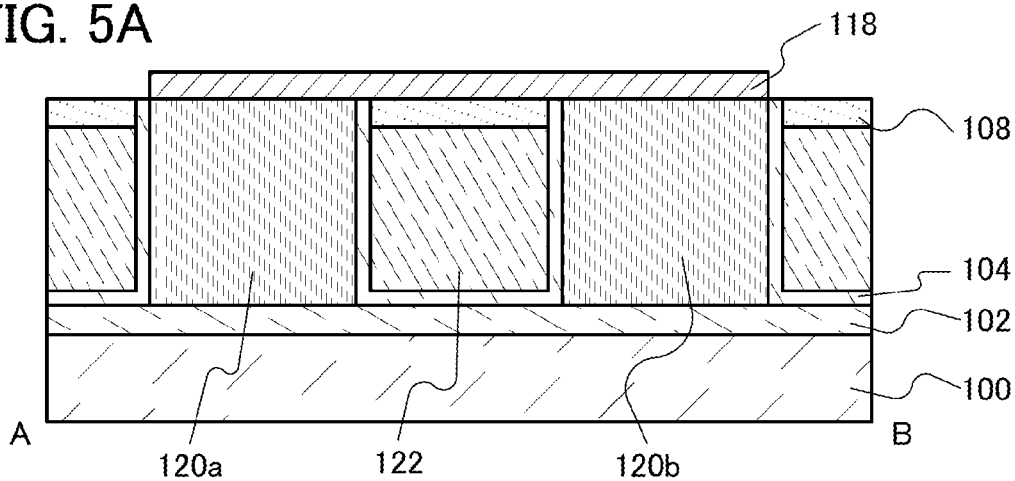
FIGS. 5A to 5C are cross-sectional views illustrating a manufacturing method of the semiconductor memory device shown in FIGS. 1A and 1B.

Next, the oxide semiconductor film is processed by a photolithography process, so that the oxide semiconductor film 118 is formed (see FIG. 5A).

Figure 5B:
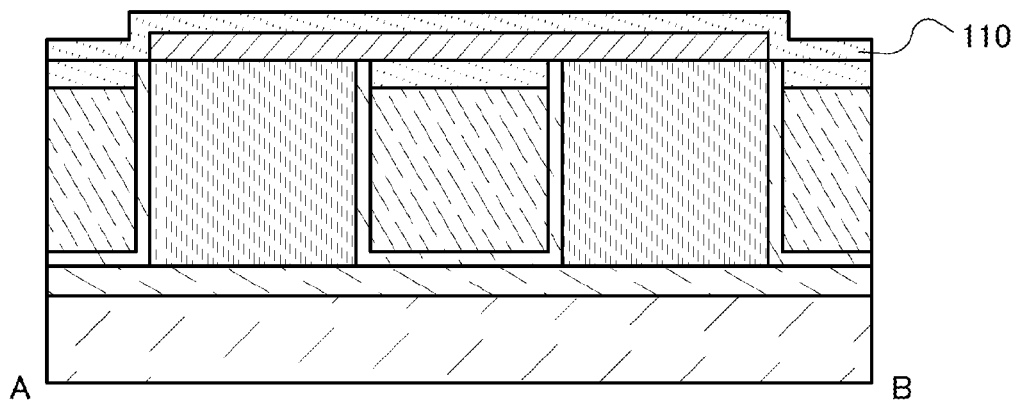

Next, the second gate insulating film 110 is formed (see FIG. 5B). The second gate insulating film 110 can be formed in a manner similar to that of any of the first insulating film 104 and the first gate insulating film 108.

Figure 5C:
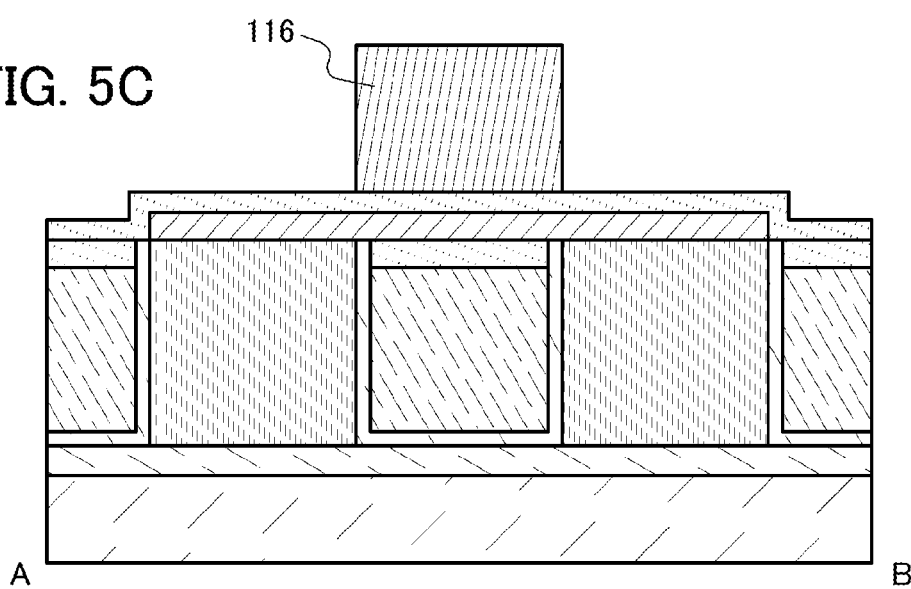

Next, the second gate electrode 116 is formed (see FIG. 5C). The second gate electrode 116 can be formed in a manner similar to that of any of the conductive films 120a and 120b and the first gate electrode 122.

Then, a second heat treatment may be performed. The second heat treatment may be performed in a manner similar to that of the first heat treatment. By the second heat treatment, oxygen is eliminated from the first gate insulating film 108, the second gate insulating film 110, or the like, so that oxygen vacancies in the oxide semiconductor film 118 and the interface state densities between the oxide semiconductor film 118 and the first gate insulating film 108 and between the oxide semiconductor film 118 and the second gate insulating film 110 can be reduced. Accordingly, the reliability of the memory cell can be increased.

Next, the second insulating film 112 is formed, and then, the electrode 114 is formed. In this manner, the memory cell shown in FIG. 1B can be formed.

Hereinafter, electrical characteristics of a transistor using an oxide semiconductor applicable to a semiconductor memory device which is one embodiment of the present invention are described.

Figure 22A:
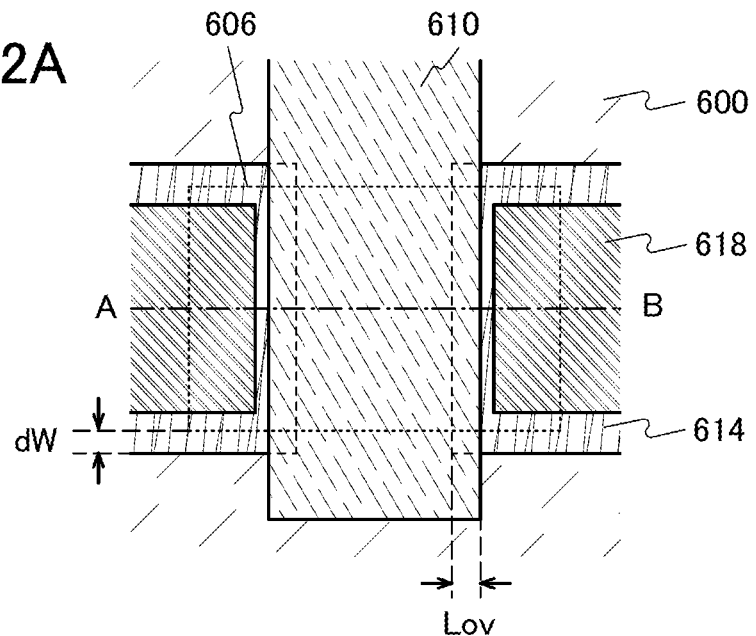
FIGS. 22A and 22B are a top view and a cross-sectional view showing a structure of a transistor.
Figure 22B:
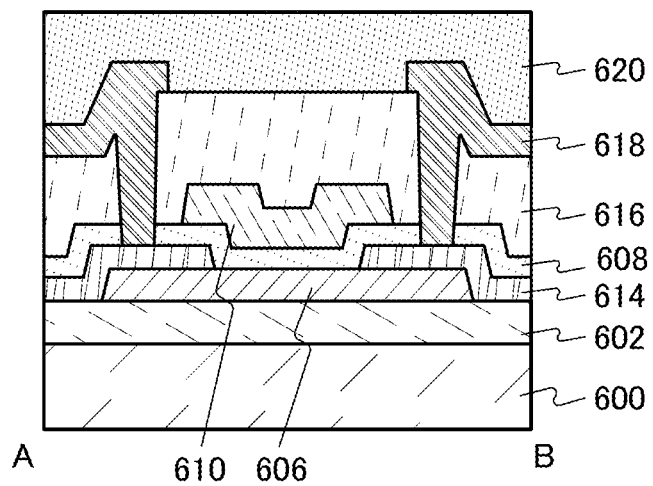

FIGS. 22A and 22B are a top view and a cross-sectional view of each of transistors (Sample 1 and Sample 2). FIG. 22A is a top view of each transistor. FIG. 22B is a cross-sectional view along dashed-dotted line A-B in FIG. 22A.

The transistor shown in FIG. 22B includes a substrate 600; a base insulating film 602 provided over the substrate 600; an oxide semiconductor film 606 provided over the base insulating film 602; a pair of electrodes 614 in contact with the oxide semiconductor film 606; a gate insulating film 608 provided over the oxide semiconductor film 606 and the pair of electrodes 614; a gate electrode 610 provided to overlap with the oxide semiconductor film 606 with the gate insulating film 608 provided therebetween; an interlayer insulating film 616 provided to cover the gate insulating film 608 and the gate electrode 610; wirings 618 electrically connected to the pair of electrodes 614 through openings formed in the gate insulating film 608 and the interlayer insulating film 616; and a protective film 620 provided to cover the interlayer insulating film 616 and the wirings 618.

A glass substrate was used as the substrate 600. A silicon oxide film was used as the base insulating film 602. An In—Sn—Zn—O film was used as the oxide semiconductor film 606. A tungsten film was used as the pair of electrodes 614. A silicon oxide film was used as the gate insulating film 608. A stacked-layer structure of a tantalum nitride film and a tungsten film was used for the gate electrode 610. A stacked-layer structure of a silicon oxynitride film and a polyimide film was used for the interlayer insulating film 616. A stacked-layer structure in which a titanium film, an aluminum film, and a titanium film are stacked in this order was used for each of the wirings 618. A polyimide film was used as the protective film 620.

In the transistor having the structure shown in FIG. 22A, the width of a portion where the gate electrode 610 overlaps with the electrode 614 is referred to as Lov. In addition, the width of a portion of the electrode 614 which does not overlap with the oxide semiconductor film 606 is referred to as dW.

A method for forming the transistor (Samples 1 and 2) having the structure shown in FIG. 22B is described below.

First, a plasma treatment was performed on a top surface of the substrate 600 in an argon atmosphere. The plasma treatment was carried out with a sputtering apparatus by applying a bias power of 200 W (RF) to the substrate 600 side for 3 minutes.

Subsequently, without breaking the vacuum, the silicon oxide film as the base insulating film 602 was formed to have a thickness of 300 nm.

The silicon oxide film was formed with a sputtering apparatus with a power of 1500 W (RF) in an oxygen atmosphere. A quartz target was used as a target. The substrate heating temperature in the film deposition was set at 100° C.

Next, a top surface of the base insulating film 602 was processed by CMP to be planarized such that Ra was about 0.2 nm.

Next, the In—Sn—Zn—O film as an oxide semiconductor film was formed to have a thickness of 15 nm.

The In—Sn—Zn—O film was formed with a sputtering apparatus with a power of 100 W (DC) in a mixed atmosphere of argon:oxygen=2:3 [volume ratio]. An In—Sn—Zn—O target of In:Sn:Zn=1:1:1 [atomic ratio] was used as a target. The substrate heating temperature in the film deposition was set at 200° C.

Next, a heat treatment was performed only on Sample 2 at 650° C. As the heat treatment, heat treatment in a nitrogen atmosphere was first performed for 1 hour and then heat treatment in an oxygen atmosphere was performed for 1 hour while keeping the temperature.

Next, the oxide semiconductor film was processed by a photolithography process, so that the oxide semiconductor film 606 was formed.

Next, the tungsten film was formed to have a thickness of 50 nm.

The tungsten film was formed with a sputtering apparatus with a power of 1000 W (DC) in an argon atmosphere. The substrate heating temperature in the film deposition was set at 200° C.

Next, the tungsten film was processed by a photolithography process, so that the pair of electrodes 614 was formed.

Next, the silicon oxide film as the gate insulating film 608 was formed to have a thickness of 100 nm. The relative permittivity of the silicon oxide film was set at 3.8.

The silicon oxide film as the gate insulating film 608 was formed in a similar manner to the base insulating film 602.

Next, the tantalum nitride film and the tungsten film were formed in this order to have thicknesses of 15 nm and 135 nm, respectively.

The tantalum nitride film was formed with a sputtering apparatus with a power of 1000 W (DC) in a mixed atmosphere of argon:oxygen=5:1. Substrate heating was not performed in the film deposition.

The tungsten film was formed with a sputtering apparatus with a power of 4000 W (DC) in an argon atmosphere. The substrate heating temperature in the film deposition was set at 200° C.

Next, the tantalum nitride film and the tungsten film were processed by a photolithography process, so that the gate electrode 610 was formed.

Next, the silicon oxynitride film as part of the interlayer insulating film 616 was formed to have a thickness of 300 nm.

The silicon oxynitride film as part of the interlayer insulating film 616 was formed with a PCVD apparatus with a power of 35 W (RF) in a mixed atmosphere of monosilane:nitrous oxide=1:200. The substrate heating temperature in the film deposition was set at 325° C.

Next, the silicon oxynitride film as part of the interlayer insulating film 616 was processed by a photolithography process.

Next, photosensitive polyimide as part of the interlayer insulating film 616 was deposited to have a thickness of 1500 nm.

Next, the photosensitive polyimide as part of the interlayer insulating film 616 was exposed to light with use of a photomask which was used in the photolithography process on the silicon oxynitride film as part of the interlayer insulating film 616, and developed, and then subjected to a heat treatment for hardening the photosensitive polyimide film. In this manner, the interlayer insulating film 616 including the silicon oxynitride film and the photosensitive polyimide film was formed. The heat treatment was performed in a nitrogen atmosphere at 300° C.

Next, the titanium film, the aluminum film, and the titanium film were formed in this order to have thicknesses of 50 nm, 100 nm, and 5 nm, respectively.

The two titanium films were formed with a sputtering apparatus with a power of 1000 W (DC) in an argon atmosphere. Substrate heating was not performed in the film deposition.

The aluminum film was formed with a sputtering apparatus with a power of 1000 W (DC) in an argon atmosphere. Substrate heating was not performed in the film deposition.

Next, the titanium film, the aluminum film, and the titanium film were processed by a photolithography process, so that the wirings 618 were formed.

Next, a photosensitive polyimide film as the protective film 620 was formed to have a thickness of 1500 nm.

Next, the photosensitive polyimide film was exposed to light with use of a photomask which was used in the photolithography process on the wirings 618, and developed, so that openings at which the wirings 618 are exposed were formed in the protective film 620.

Next, a heat treatment for hardening the photosensitive polyimide film was performed thereon. The heat treatment was performed in a similar manner to the heat treatment performed on the photosensitive polyimide film as the interlayer insulating film 616.

Through the above process, the transistor having the structure shown in FIG. 22B was formed.

Next, electrical characteristics of the transistor having the structure shown in FIG. 22B were evaluated.

Figure 23A:
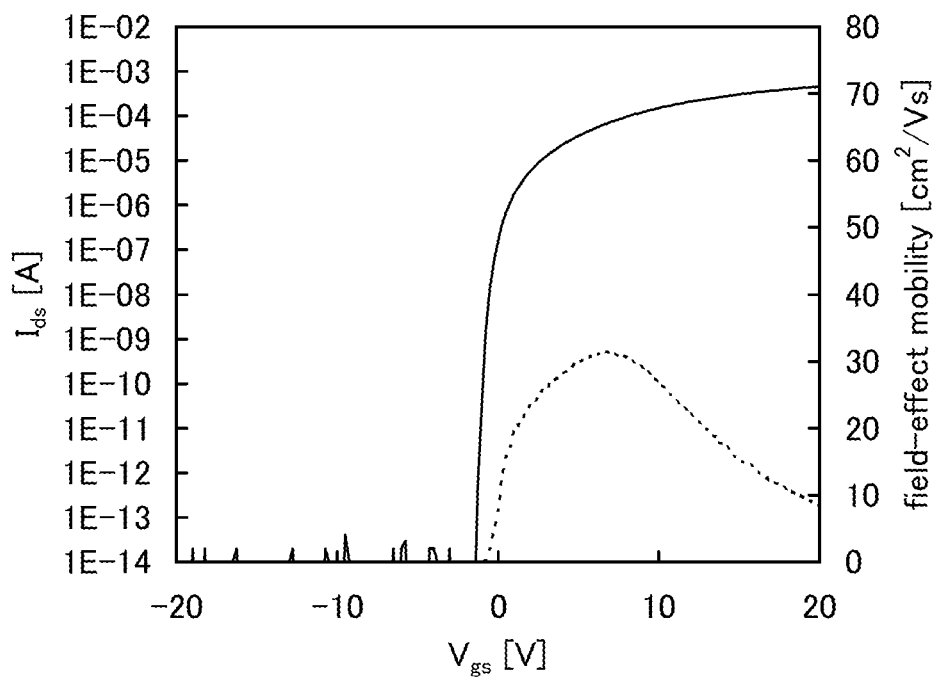
FIGS. 23A and 23B are graphs showing the $V_{gs}$-$I_{ds}$ characteristics and the field-effect mobilities of transistors of Samples 1 and 2.
Figure 23B:
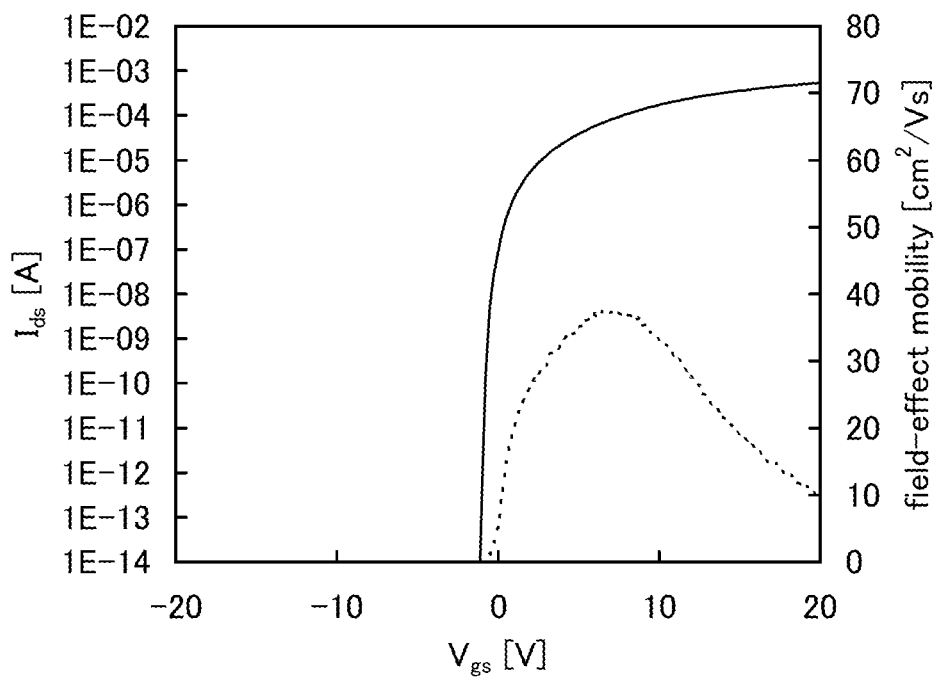

Here, $V_{gs}$-$I_{ds}$ characteristics of the transistor having the structure shown in FIG. 22B were measured; the results of Sample 1 are shown in FIG. 23A, and the results of Sample 2 are shown in FIG. 23B. Each transistor used for the measurement has a channel length L of 3 μm, a channel width W of 10 μm, Loy of 3 μm per side (6 μm in total), and dW of 3 μm per side (6 μm in total). Further, $V_{ds}$ was set at 10 V.

Comparing Samples 1 and 2, it is found that the field-effect mobility of the transistor is increased by performing heat treatment after formation of the oxide semiconductor film. This is deemed because the impurity concentration in the oxide semiconductor film was reduced by the heat treatment; accordingly, it is understood that the impurity concentration in the oxide semiconductor film was reduced by heat treatment performed after the oxide semiconductor film was formed, whereby the field-effect mobility of the transistor could be increased close to ideal field-effect mobility.

As described above, it is found that the impurity concentration in the oxide semiconductor film is reduced by performing heat treatment after formation of the oxide semiconductor film, and the field-effect mobility of the transistor is consequently increased.

Next, a BT test was performed on Samples 1 and 2. The BT test is described below.

First, $V_{gs}$-$I_{ds}$ characteristics of each transistor were measured at a substrate temperature of 25° C. at $V_{ds}$ of 10 V. Then, the substrate temperature was changed to 150° C. and $V_{ds}$ was changed to 0.1 V. After that, 20 V was applied as $V_{gs}$ so that the intensity of an electric field applied to the gate insulating film 608 was 2 MV/cm, and the condition was kept for 1 hour. Next, $V_{gs}$ was changed to 0 V. Then, the $V_{gs}$-$I_{ds}$ characteristics of each transistor were measured again at the substrate temperature of 25° C. at $V_{ds}$ of 10 V. This is called a positive BT test.

In a similar manner, first, $V_{gs}$-$I_{ds}$ characteristics of each transistor were measured at a substrate temperature of 25° C. at $V_{ds}$ of 10 V. Then, the substrate temperature was changed to 150° C. and $V_{ds}$ was changed to 0.1 V. After that, −20 V was applied as $V_{gs}$ so that the intensity of an electric field applied to the gate insulating film 608 was −2 MV/cm, and the condition was kept for 1 hour. Next, $V_{gs}$ was changed to 0 V. Then, the $V_{gs}$-$I_{ds}$ characteristics of each transistor were measured again at the substrate temperature of 25° C. at $V_{ds}$ of 10 V. This is called a negative BT test.

Figure 24A:
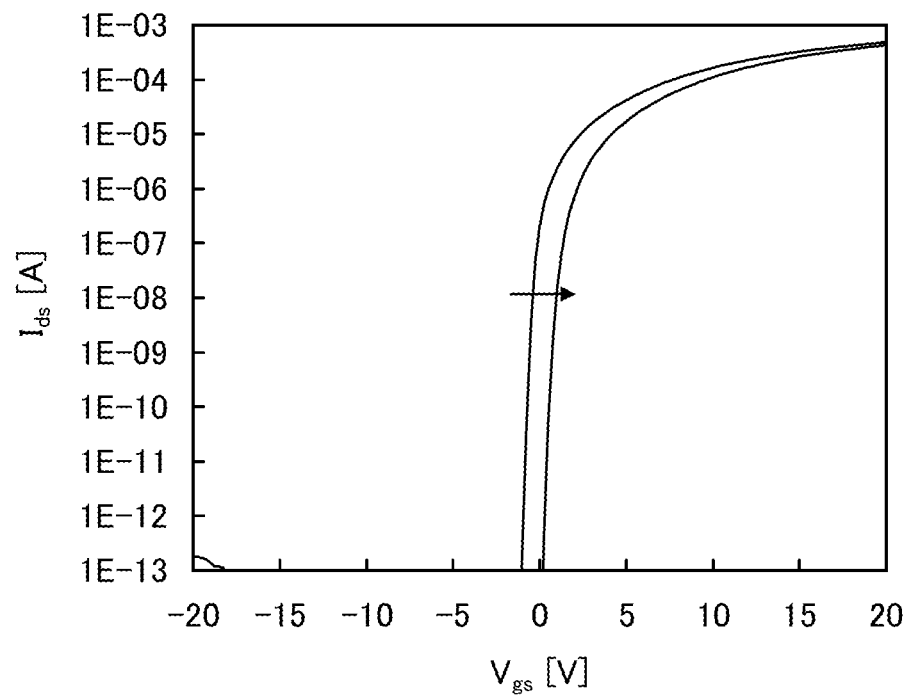
FIGS. 24A and 24B are graphs showing the $V_{gs}$-$I_{ds}$ characteristics of the transistor of Sample 1, which were measured before and after respective BT tests.
Figure 24B:
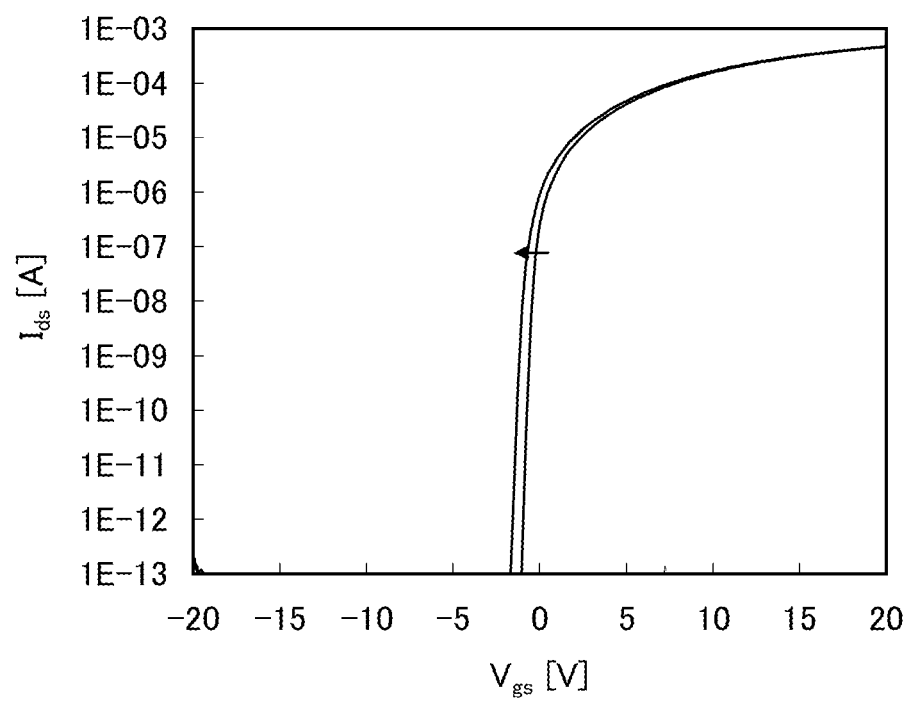
Figure 25A:
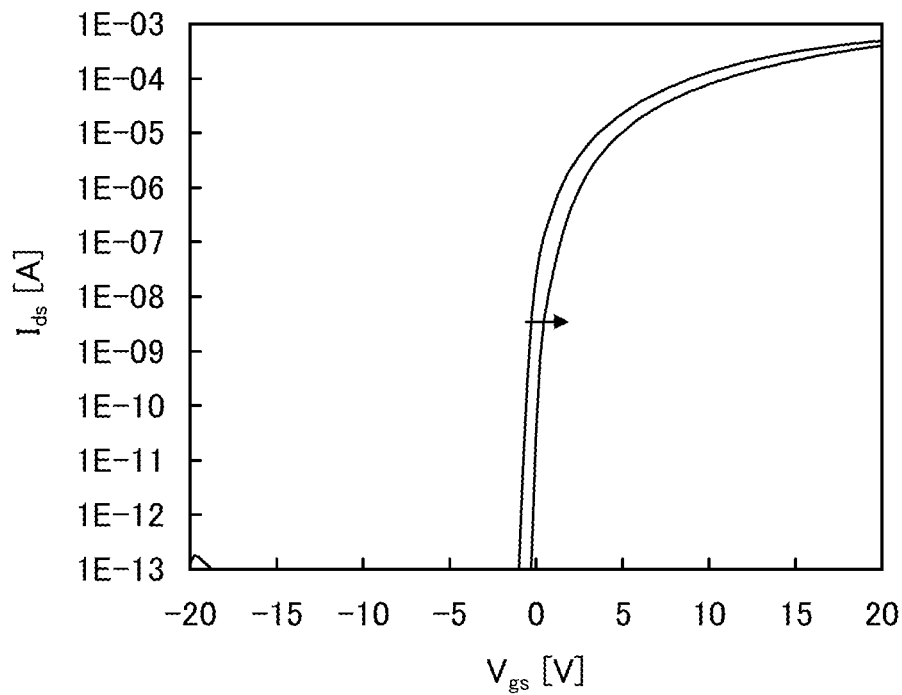
FIGS. 25A and 25B are graphs showing the $V_{gs}$-$I_{ds}$ characteristics of the transistor of Sample 2, which were measured before and after respective BT tests.
Figure 25B:
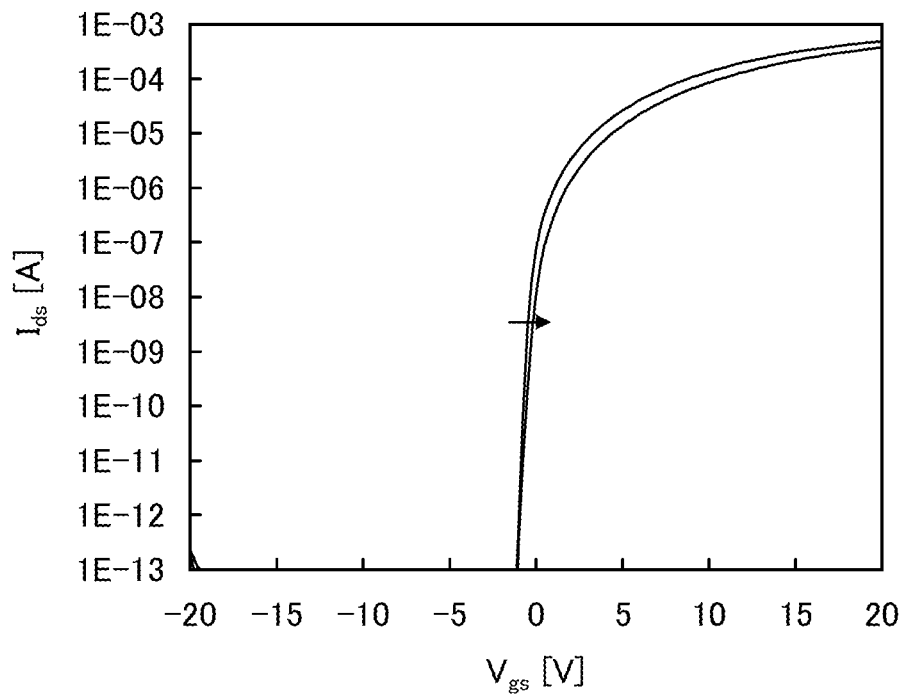

FIGS. 24A and 24B show a result of the positive BT test of Sample 1 and a result of the negative BT test of Sample 1, respectively. FIGS. 25A and 25B show a result of the positive BT test of Sample 2 and a result of the negative BT test of Sample 2, respectively. An arrow is given for clarifying a shift in $V_{gs}$-$I_{ds}$ characteristics measured before and after the BT test in each graph.

Respective amounts of shift in the threshold voltage of Sample 1 due to the positive BT test and due to the negative BT test were 1.80 V and −0.42 V. Respective amounts of shift in the threshold voltage of Sample 2 due to the positive BT test and due to the negative BT test were 0.79 V and 0.76 V.

It is found that, in each of Sample 1 and Sample 2, the amount of shift in the threshold voltage measured before and after the BT test is small and thus the reliability is high.

Next, a relation between the substrate temperature and the electrical characteristics of a transistor of Sample 2 was evaluated.

The transistor measured has a channel length L of 3 μm, a channel width W of 10 μm, Loy of 3 μm per side (6 μm in total), and dW of 0 μm. Further, $V_{ds}$ was set at 10 V. The substrate temperature was −40° C., −25° C., 25° C., 75° C., 125° C., and 150° C.

Figure 26A:
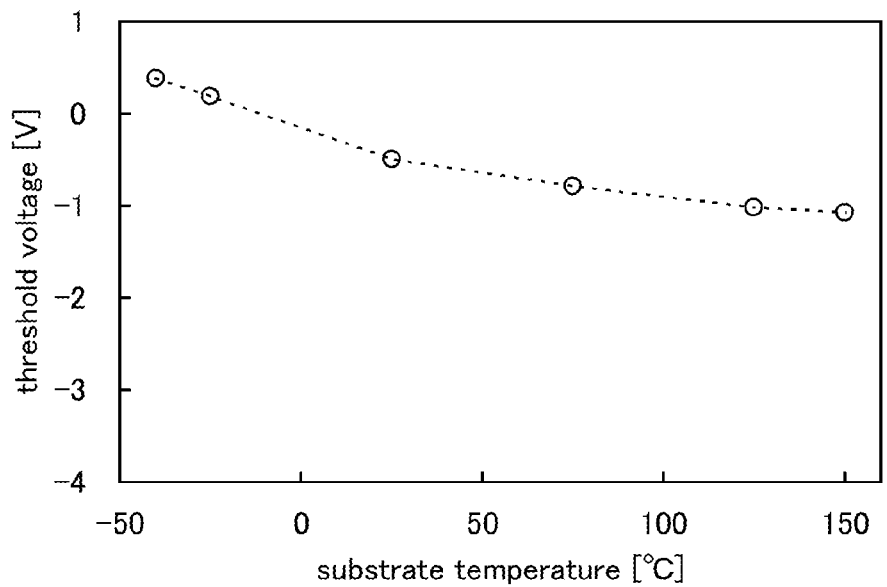
FIGS. 26A and 26B are graphs showing a relation between the substrate temperature and the threshold voltage and a relation between the substrate temperature and the field-effect mobility of a transistor of Sample 2.
Figure 26B:
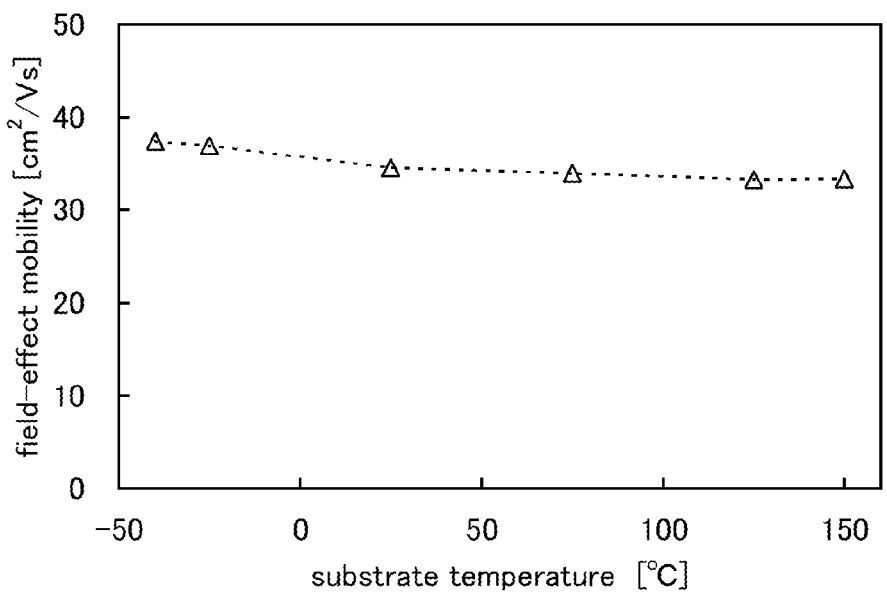

FIG. 26A shows a relation between the substrate temperature and the threshold voltage, and FIG. 26B shows a relation between the substrate temperature and the field-effect mobility.

From FIG. 26A, it is found that the threshold voltage gets lower as the substrate temperature increases. The threshold voltage was decreased from 0.38 V to −1.08 V in the range from −40° C. to 150° C.

From FIG. 26B, it is found that the field-effect mobility gets lower as the substrate temperature increases. The field-effect mobility was decreased from 37.4 $cm^2$/Vs to 33.4 $cm^2$/Vs in the range from −40° C. to 150° C.

Thus, it is found that the electrical characteristics of Sample 2 shift less in the above temperature range.

It is found that the transistor described above has a high field-effect mobility and the reliability thereof is high.

Further, the off-state current per micrometer of a channel width of the transistor applicable to the semiconductor memory device which is one embodiment of the present invention was evaluated.

A sample thereof was formed in a similar manner to Sample 2. The transistor measured has a channel length L of 3 μm, a channel width W of 10 cm, Loy of 2 μm, and dW of 0 μm.

Figure 27:
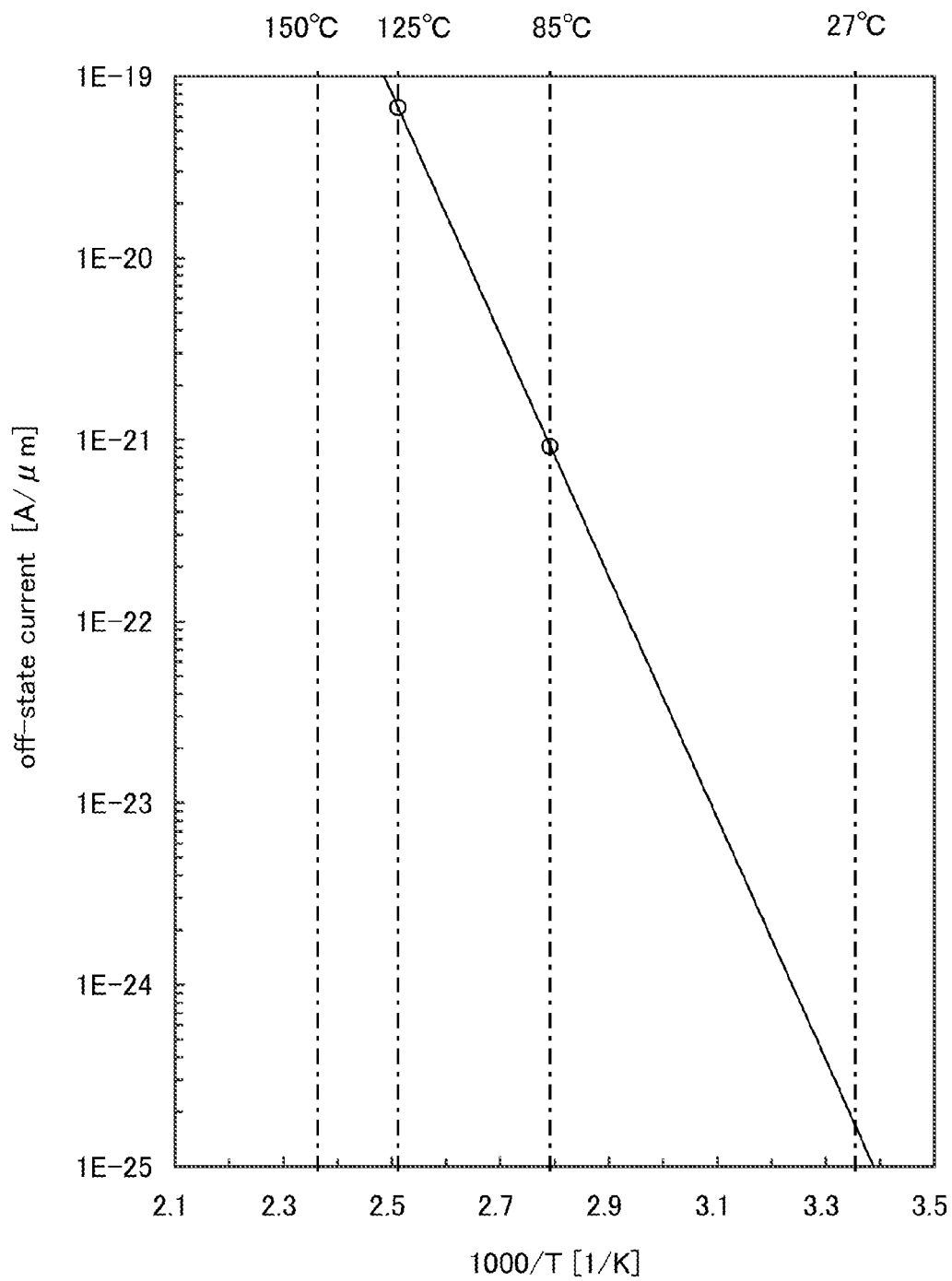
FIG. 27 is a graph showing the off-state current of a transistor using an oxide semiconductor film.

FIG. 27 shows a relation between the off-state current of the transistor and the inverse of the substrate temperature (absolute temperature) at measurement. For simplicity, a value (1000/T) obtained by multiplying the inverse of the substrate temperature at measurement by 1000 is indicated by the horizontal axis.

A method for measuring the off-state current of the transistor is simply described below. A transistor which is an object to be measured is called a first transistor here for convenience.

A drain of the first transistor is connected to a floating gate FG, and the floating gate FG is connected to a gate of a second transistor.

First, the first transistor is turned off, and electric charge is supplied to the floating gate FG, where a certain drain voltage is applied to the second transistor.

Consequently, the electric charge at the floating gate FG gradually leaks through the first transistor to change the source potential of the second transistor. The amount of electric charge leaked from the first transistor can be estimated from that amount of change of the source potential in relation to time, whereby the off-state current can be measured.

From FIG. 27, the off-state current of the transistor at a substrate temperature of 85° C. was $1 \times 10^{-21}$ A/μm (1 zA/μm).

It is thus found that the off-state current of the transistor is extremely small.

With such a transistor whose reliability is high and whose off-state current is small as described above, a memory cell whose reliability is high and involving less frequency of refresh operations can be realized.

In the general case where a back gate electrode is provided, it is necessary that the size of a transistor is large in order to isolate the back gate electrode from a source electrode and a drain electrode; however, the use of the first gate electrode 122 as the back gate electrode enables a minute transistor having a back gate electrode to be formed. Accordingly, the integration degree of the semiconductor memory device using the memory cell shown in FIGS. 1A and 1B can be increased.

In the memory cell described in this embodiment, the threshold voltage of the transistor is controlled and the off-state current of the transistor is extremely small, so that the frequency of refresh operations can be reduced. Accordingly, a semiconductor memory device with less power consumption can be provided.

Further, it is unnecessary that the area of the memory cell is large even when the back gate electrode is provided for the transistor, which enables a semiconductor memory device with a high integration degree to be provided.

Further, the conductive film which is in the same layer as the first gate electrode is provided so as to surround the memory cell, which enables a semiconductor memory device in which the conductive film functions as a guard ring and thus electrostatic breakdown is less likely to occur to be provided.

This embodiment can be combined with any other embodiment as appropriate.

Embodiment 2

In this embodiment, a semiconductor memory device whose structure is different from that of the semiconductor memory device described in Embodiment 1 is described with reference to FIGS. 6A and 6B, FIG. 7, FIGS. 8A to 8D, FIGS. 9A to 9C, and FIGS. 10A to 10C.

Figure 6A:
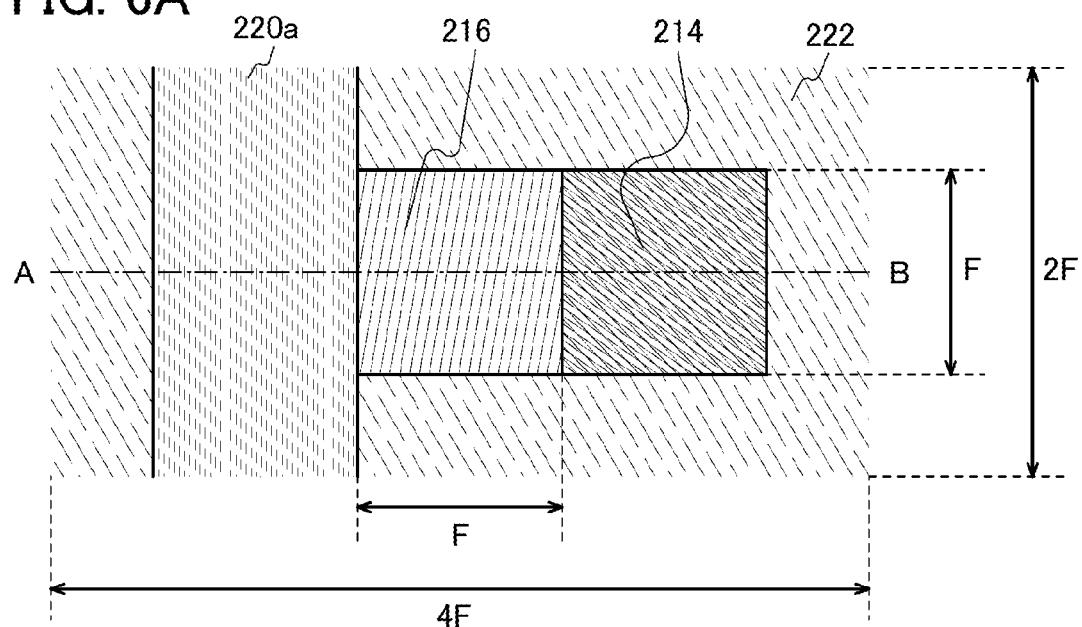
FIGS. 6A and 6B are a top view and a cross-sectional view showing an example of a memory cell included in a semiconductor memory device.
Figure 6B:
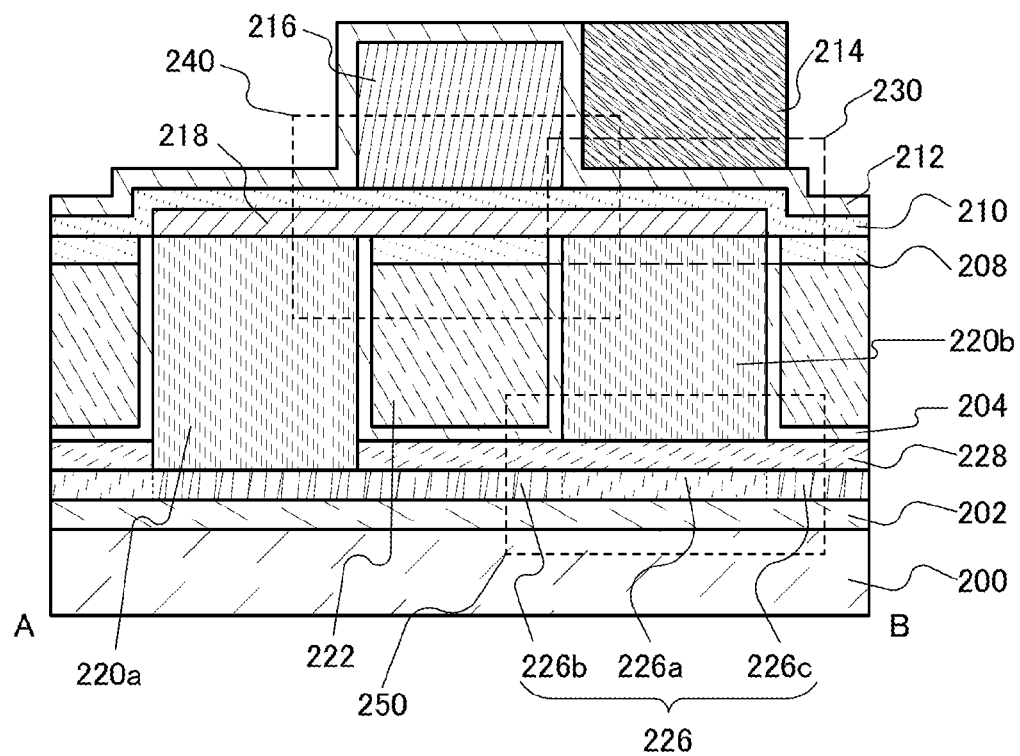

FIGS. 6A and 6B are a top view (see FIG. 6A) and a cross-sectional view (see FIG. 6B) of a memory cell.

It is seen from FIG. 6A that the size of the memory cell is $8F^2$ (2F (in length)×4F (in width)).

It is seen from FIG. 6B that the memory cell includes a first transistor 250, a second transistor 240, and a capacitor 230.

The memory cell is provided over a substrate 200 and a base insulating film 202 over the substrate 200. The base insulating film 202 is not necessarily provided, which depends on the top surface condition of the substrate 200.

The first transistor 250 includes a semiconductor film 226 including a high resistance region 226a, a low resistance region 226b, and a low resistance region 226c; a gate insulating film 228 provided over the semiconductor film 226; and a conductive film 220b provided so as to overlap with the high resistance region 226a with the gate insulating film 228 provided therebetween.

The second transistor 240 includes the conductive film 220b; a conductive film 220a which is connected to the low resistance region 226b through an opening formed in the gate insulating film 228 and is formed in the same layer using the same material as the conductive film 220b; a first insulating film 204 provided in contact with a top surface of the gate insulating film 228 and respective side surfaces of the conductive films 220a and 220b; a first gate electrode 222 which is provided between the conductive films 220a and 220b with the first insulating film 204 provided between the first gate electrode 222 and each of the conductive films 220a and 220b and whose top surface is at a lower level than respective top surfaces of the conductive films 220a and 220b; a first gate insulating film 208 provided over the first gate electrode 222; an oxide semiconductor film 218 provided in contact with the first gate insulating film 208 and the conductive films 220a and 220b; a second gate insulating film 210 provided over the oxide semiconductor film 218; and a second gate electrode 216 provided so as to overlap with the oxide semiconductor film 218 with the second gate insulating film 210 provided therebetween. A second insulating film 212 may be provided to cover the second transistor 240.

The capacitor 230 includes the conductive film 220b, the second gate insulating film 210, and an electrode 214.

The substrate 200, the base insulating film 202, the conductive film 220b, the conductive film 220a, the first insulating film 204, the first gate electrode 222, the first gate insulating film 208, the oxide semiconductor film 218, the second gate insulating film 210, the second gate electrode 216, the second insulating film 212, and the electrode 214 may be formed using manners and materials which are similar to respective those of the substrate 100, the base insulating film 102, the conductive film 120b, the conductive film 120a, the first insulating film 104, the first gate electrode 122, the first gate insulating film 108, the oxide semiconductor film 118, the second gate insulating film 110, the second gate electrode 116, the second insulating film 112, and the electrode 114.

The semiconductor film 226 may be formed using a known semiconductor material typified by polycrystalline silicon, single-crystal silicon, polycrystalline germanium, single-crystal germanium, or gallium arsenide.

The conductive film 220a functions as a source electrode of the first transistor 250 and a source electrode of the second transistor 240. The conductive film 220b functions as a gate of the first transistor 250, a drain electrode of the second transistor 240, and one of a pair of electrodes of the capacitor 230. The high resistance region 226a, the low resistance region 226b, and the low resistance region 226c function as a channel region, a source region, and a drain region of the first transistor 250, respectively.

The first gate electrode 222 functions as a back gate electrode for controlling the threshold voltage of the second transistor 240. Further, a conductive film in the same layer as the first gate electrode 222 is provided to surround the memory cell, and thus functions as a guard ring, thereby preventing electrostatic breakdown of the memory cell.

The conductive film 220a is connected to a bit line. In this embodiment, the conductive film 220a is extended to form the bit line.

Further, the second gate electrode 216 is connected to a word line and the low resistance region 226c is connected to a source line, though not shown.

Next, a circuit diagram of a memory cell array in which the plurality of memory cells each described in FIGS. 6A and 6B is described with reference to FIG. 7.

The memory cell array includes a word line WL, a bit line BL, a source line SL, a back gate line BGL, and a memory cell MC.

In the memory cell MC, a source of the first transistor 250 and a source of the second transistor 240 are connected to the bit line BL, a drain of the first transistor 250 is connected to the source line SL, a gate of the second transistor 240 is connected to the word line WL, a gate of the first transistor 250 is connected to a drain of the second transistor 240 and the one of the pair of electrodes of the capacitor 230, a back gate of the second transistor 240 is connected to the back gate line BGL, and the other of the electrodes of the capacitor 230 is grounded.

A bit line BL_1 is shared between a memory cell MC_1_1 and a memory cell MC_2_1, and a word line WL_1 and a source line SL_1 are shared between the memory cell MC_1_1 and a memory cell MC_1_2. That is, the bit line BL is shared per column, and the word line WL and the source line SL are shared per row.

Here, the gate of the first transistor 250 is the conductive film 220b, the source of the first transistor 250 is the low resistance region 226b, the drain of the first transistor 250 is the low resistance region 226c, the gate of the second transistor 240 is the second gate electrode 216, the source of the second transistor 240 is the conductive film 220a, the drain of the second transistor 240 is the conductive film 220b, and the back gate of the second transistor 240 is the first gate electrode 222.

The back gate line BGL may be connected to a switching element and a capacitor. In that case, a potential is applied to the back gate line BGL through the switching element. The potential is held in the capacitor by turning off the switching element. It is preferable that the switching element be normally off; accordingly, the potential can be kept being held even after power is stopped being supplied to the switching element. For example, a transistor similar to the second transistor 240 may be used as the switching element.

By providing the back gate line BGL in this manner, the threshold voltage of second transistor 240 can be controlled. For example, a negative voltage (potential lower than the source potential of the second transistor 240) may be applied to the back gate line BGL to shift the threshold voltage of the second transistor 240 in the positive direction, whereby the second transistor 240 can be off with certainly at a gate voltage of 0 V (when power is not supplied). Accordingly, data of the memory cell MC can be retained for a long period of time even while power is not supplied.

Figure 7:
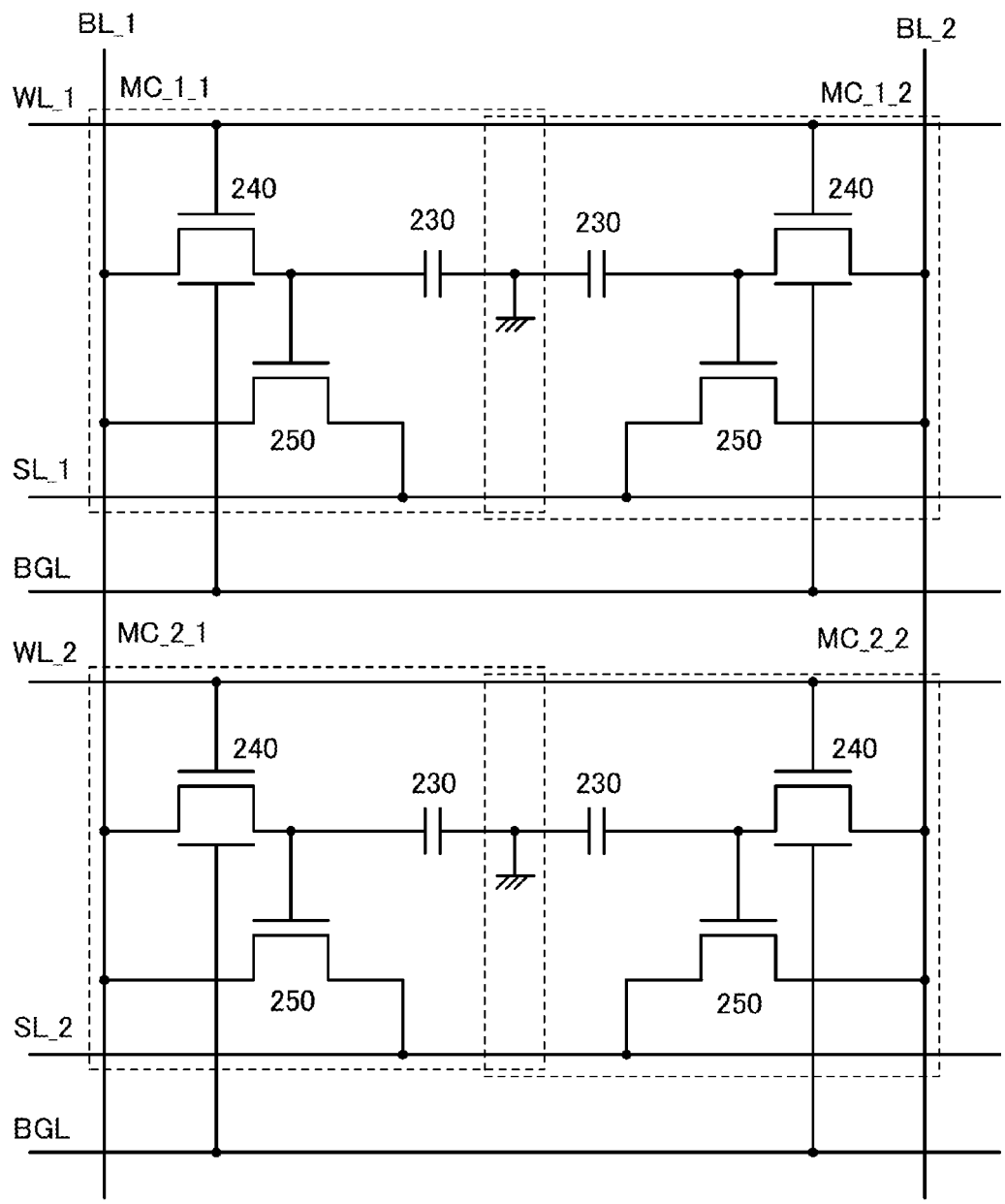
FIG. 7 is a circuit diagram showing an example of a memory cell array in which the memory cells each of which is shown in FIGS. 6A and 6B are arranged in matrix.

Next, a method of writing data to the memory cell array shown in FIG. 7 and a method of reading data therefrom are described.

First, a method of writing data to the memory cell array is described.

Data writing is performed per row. Here, data writing is started from the memory cell MC_1_1 and the memory cell MC_1_2.

First, a potential VH (potential higher than VDD by the threshold voltage (Vth) of the second transistor 240 or more) is applied to the word line WL_1, and then, a potential GND is applied to a word line WL_2, the source line SL_1, and a source line SL_2. Then, the potential VDD is applied to the bit line BL at each column of the memory cell(s) to which data 1 is written, whereas the potential GND is applied to the bit line BL at each column of the memory cell(s) to which data 0 is written. Consequently, the potential of the capacitor 230 in each memory cell to which data 1 is written comes to be VDD, whereas the potential of the capacitor 230 in each memory cell to which data 0 is written comes to be GND.

Next, moving on to the next row, data is writing to the memory cell MC_2_1 and a memory cell MC_2_2 in a manner similar to the above.

By the above-described method, data can be written to the memory cell array.

Next, a method of holding data written to the memory cell array is described.

Written data can be held by the following method: the word line WL_1, the word line WL_2, the bit line BL_1, a bit line BL_2, the source line SL_1, and the source line SL_2 are made into a floating state; or the potential GND (or a potential lower than GND) is applied to the word line WL_1, the word line WL_2, the bit line BL_1, the bit line BL_2, the source line SL_1, and the source line SL_2.

By the above-described method, written data can be held in the memory cell array.

Next, a method of reading data held in the memory cell array is described.

Data reading is performed per row. Here, data reading is started from the memory cell MC_1_1 and the memory cell MC_1_2.

First, the potential VDD is applied to the source line SL_1, and the potential GND is applied to the source line SL_2, the word line WL_1, and the word line WL_2. The bit line BL_1 and the bit line BL_2 are connected to a pull-down circuit, though not shown. With the pull-down circuit, the bit line BL can be fixed at the potential GND when being electrically connected to no element except the pull-down circuit. That is, in the memory cell MC holding data 1, the first transistor 250 is turned on, so that the potential of the bit line BL comes to be VDD; in the memory cell MC holding data 0, the first transistor 250 is turned off, so that the potential of the bit line BL comes to be GND. In this manner, data can be read from the potential of the bit line BL.

Next, moving on to the next row, data is read from the memory cell MC_2_1 and a memory cell MC_2_2 in a manner similar to the above.

By the above-described method, data held in the memory cell array can be read.

The methods of writing and reading data to/from the memory cell array are described above.

A method for forming the memory cell shown in FIGS. 6A and 6B is described with reference to FIGS. 8A to 8D, FIGS. 9A to 9C, and FIGS. 10A to 10C.

First, the base insulating film 202 is formed over the substrate 200. Next, a semiconductor film 276 is formed by a sputtering method, an evaporation method, a PCVD method, a PLD method, an ALD method, a MBE method, or the like (see FIG. 8A).

A semiconductor substrate, such as an SOI substrate, including the substrate 200, the base insulating film 202, and the semiconductor film 276 may be used.

Figure 8A:
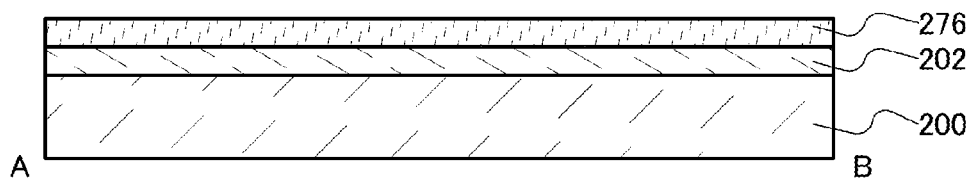
FIGS. 8A to 8D are cross-sectional views illustrating a manufacturing method of the semiconductor memory device shown in FIGS. 6A and 6B.
Figure 8B:
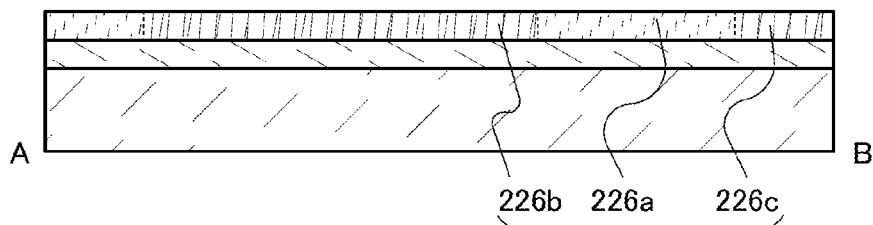

Next, impurities are selectively added to the semiconductor film 276 by using a photolithography process, so that the high resistance region 226a, the low resistance region 226b, and the low resistance region 226c are formed (see FIG. 8B).

Figure 8C:
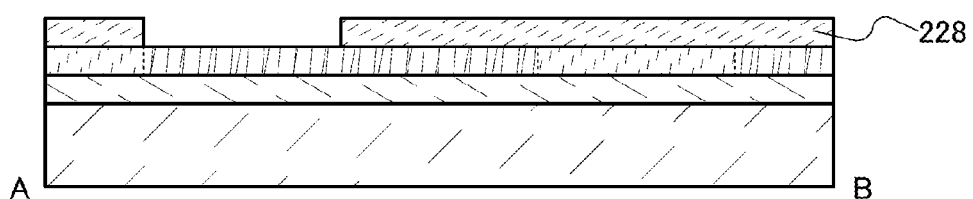

Next, an insulating film is formed by a sputtering method, an evaporation method, a PCVD method, a PLD method, an ALD method, an MBE method, or the like, and then processed by a photolithography process, so that the gate insulating film 228 is formed (see FIG. 8C).

Figure 8D:
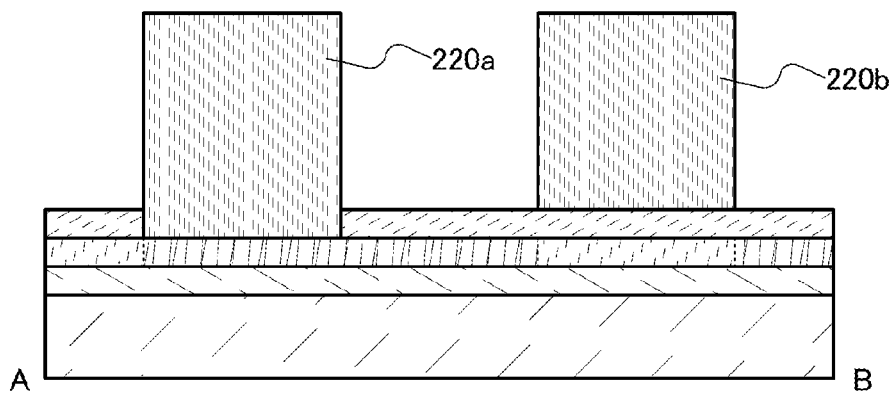

Next, the conductive films 220a and 220b are formed (see FIG. 8D).

Figure 9A:
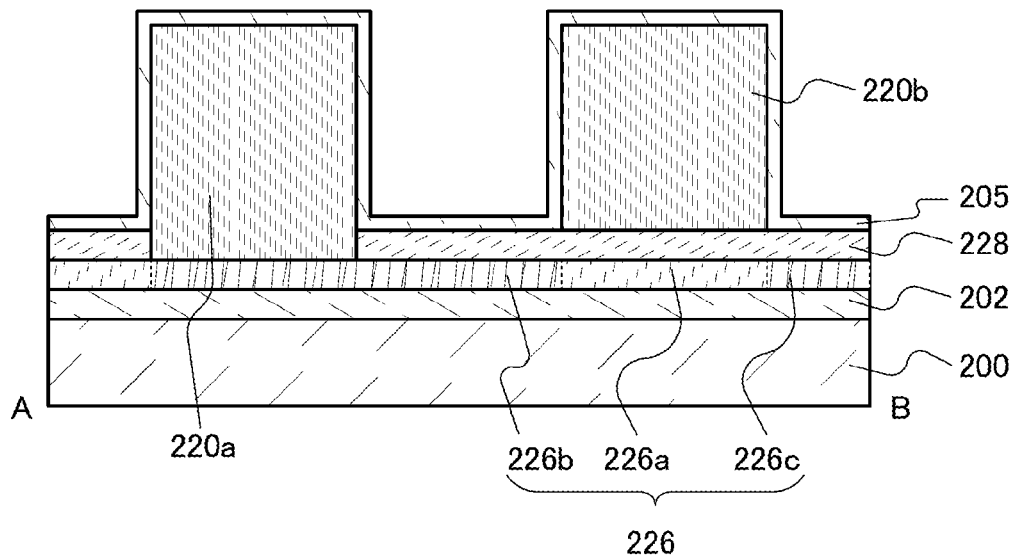
FIGS. 9A to 9C are cross-sectional views illustrating a manufacturing method of the semiconductor memory device shown in FIGS. 6A and 6B.

Next, a first insulating film 205 is formed (see FIG. 9A).

Figure 9B:
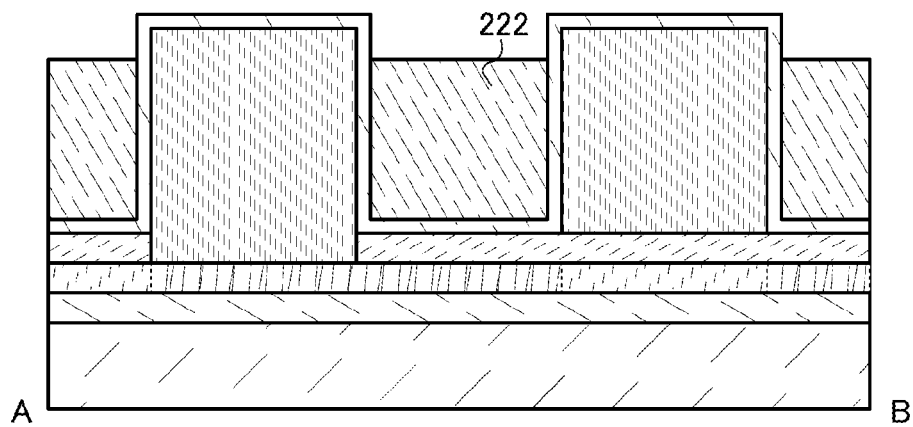

Next, the first gate electrode 222 is formed (see FIG. 9B).

Figure 9C:
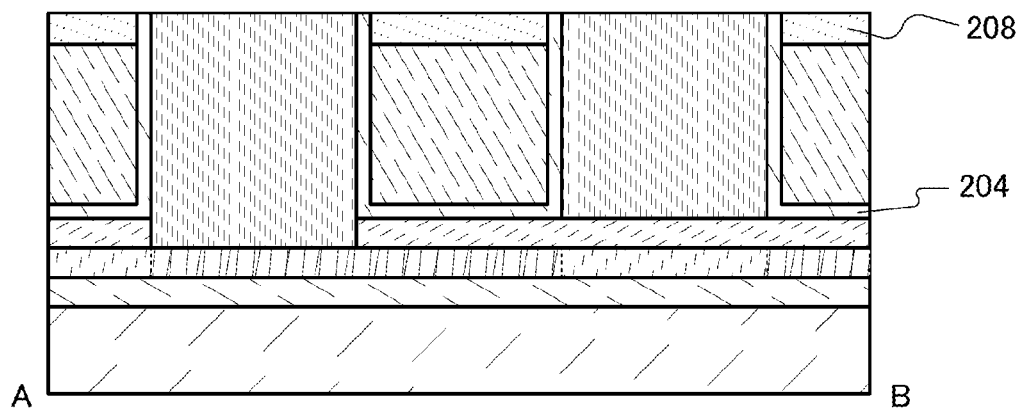

Next, the first gate insulating film 208 is formed (see FIG. 9C).

Next, an oxide semiconductor film is formed.

Next, a first heat treatment is performed thereon. For the first heat treatment, the first heat treatment described in Embodiment 1 is referred to.

An oxygen ion may be added into the oxide semiconductor film and impurities such as hydrogen may be eliminated from the oxide semiconductor film by performing heat treatment. Further, the oxide semiconductor film may be crystallized by the heat treatment or the subsequent heat treatment (such as the first heat treatment).

Figure 10A:
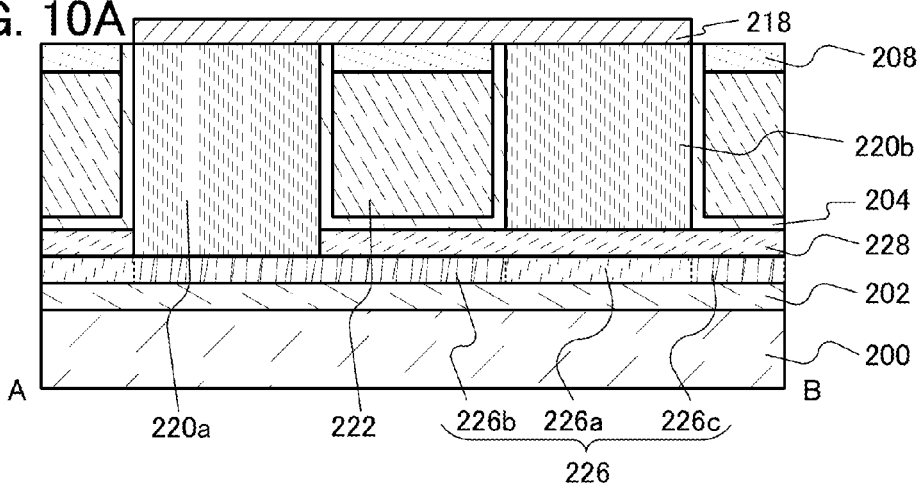
FIGS. 10A to 10C are cross-sectional views illustrating a manufacturing method of the semiconductor memory device shown in FIGS. 6A and 6B.

Next, the oxide semiconductor film is processed, so that the oxide semiconductor film 218 is formed (see FIG. 10A).

Figure 10B:
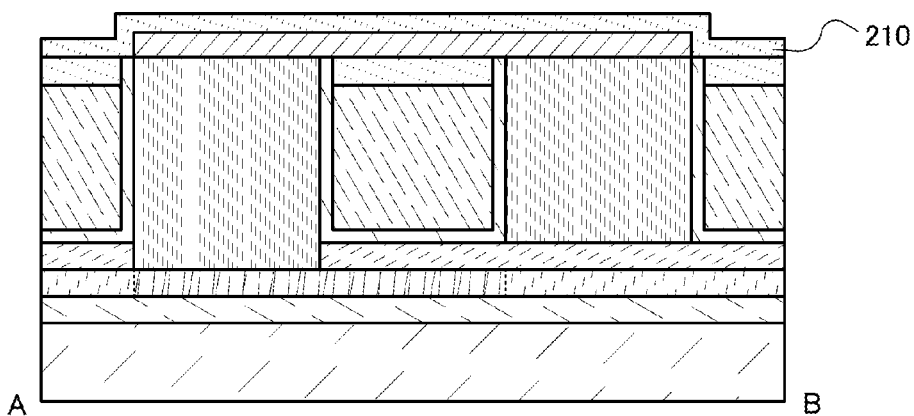

Next, the second gate insulating film 210 is formed (see FIG. 10B).

Figure 10C:
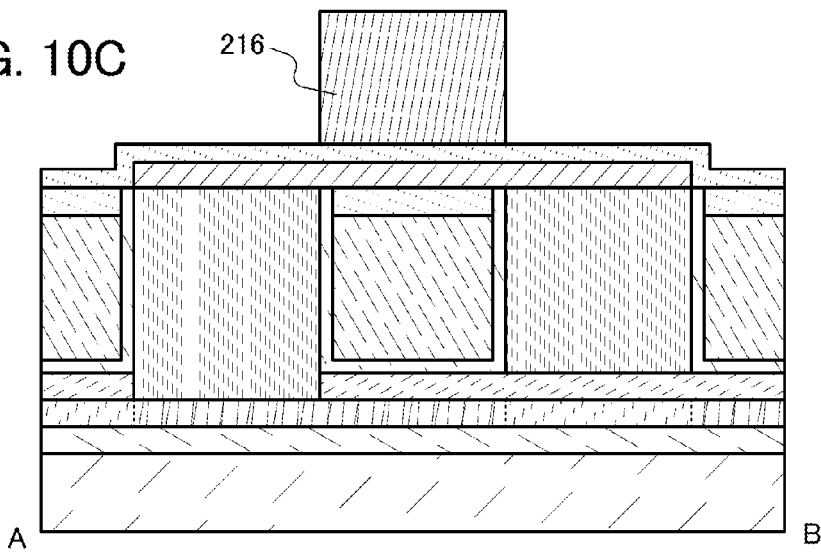

Next, the second gate electrode 216 is formed (see FIG. 10C).

Here, a second heat treatment may be performed thereon. For the second heat treatment, the second heat treatment described in Embodiment 1 is referred to.

Next, the second insulating film 212 is formed, and then, the electrode 214 is formed. In this manner, the memory cell shown in FIG. 6B can be formed.

In the general case where a back gate electrode is provided, it is necessary that the size of a transistor is large in order to isolate the back gate electrode from a source electrode and a drain electrode; however, the use of the first gate electrode 222 as the back gate electrode enables a minute transistor having a back gate electrode to be formed. Accordingly, the integration degree of the semiconductor memory device using the memory cell shown in FIGS. 6A and 6B can be increased.

In the memory cell described in this embodiment, the threshold voltage of the transistor is controlled and the off-state current of the transistor is extremely small, so that data written in the memory cell can be retained for a long period. Accordingly, a semiconductor memory device with less power consumption can be provided.

Further, it is unnecessary that the area of the memory cell is large even when the back gate electrode is provided for the transistor, which enables a semiconductor memory device with a high integration degree to be provided.

Further, the conductive film which is in the same layer as the first gate electrode is provided so as to surround the memory cell, which enables a semiconductor memory device in which the conductive film functions as a guard ring and thus electrostatic breakdown is less likely to occur to be provided.

This embodiment can be combined with any other embodiment as appropriate.

Embodiment 3

A central processing unit (CPU) can be formed with use of any of the semiconductor memory devices described in Embodiments 1 and 2 for at least part of the CPU.

Figure 11A:
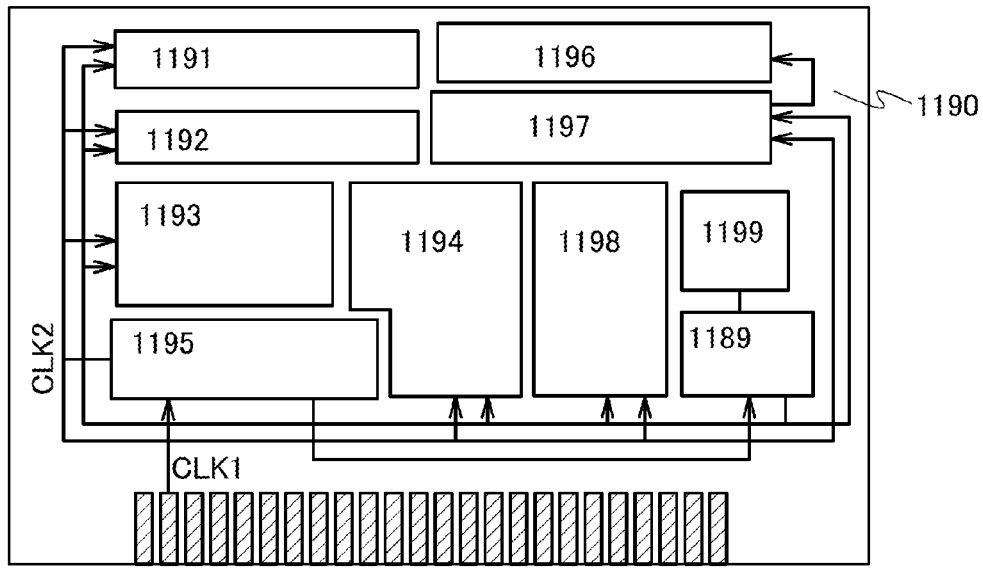
FIG. 11A is a block diagram illustrating a specific example of a CPU including a transistor which is one embodiment of the present invention and FIGS. 11B and 11C are circuit diagrams each illustrating part of the CPU.

FIG. 11A is a block diagram illustrating a specific structure of the CPU. The CPU illustrated in FIG. 11A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over another chip. It is needless to say that the CPU illustrated in FIG. 11A is only an example in which the structure is simplified to be depicted; an actual CPU may have various structures depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 has an internal clock generator for generating an internal clock signal CLK2 based on a reference clock signal CLK1, and supplies the clock signal CLK2 to the above circuits.

Any of the semiconductor devices described in Embodiments 1 and 2 is provided in the register 1196 in the CPU illustrated in FIG. 11A.

In the CPU illustrated in FIG. 11A, the register controller 1197 selects operation of holding data in the register 1196 in accordance with an instruction from the ALU 1191. That is, the register controller 1197 selects whether data is held by a phase-inversion element or a capacitor in the semiconductor memory device included in the register 1196. When data holding by the phase-inversion element is selected, a power supply voltage is supplied to the semiconductor memory device in the register 1196. When data holding by the capacitor is selected, the data in the capacitor is rewritten, and supply of the power supply voltage to the semiconductor memory device in the register 1196 can be stopped.

Figure 11B:
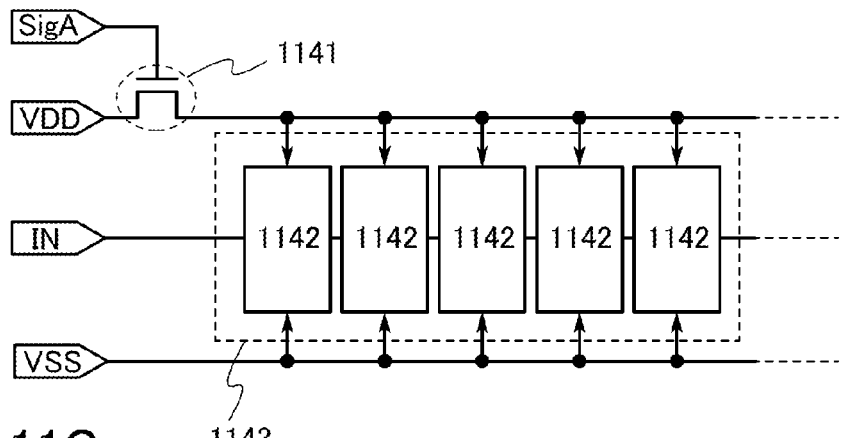
Figure 11C:
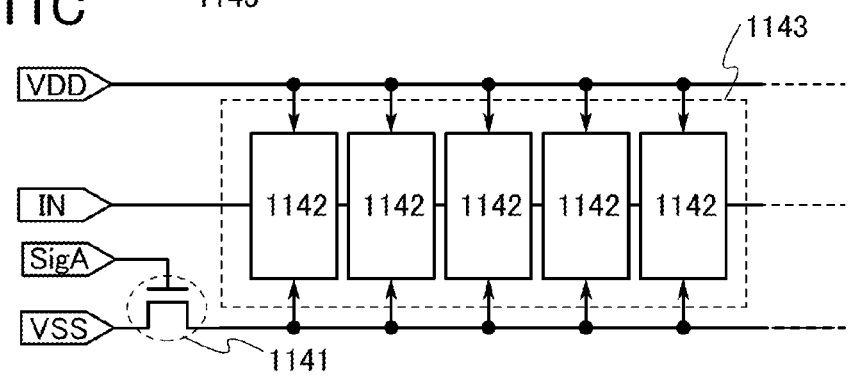

The power supply can be stopped by a switching element provided between a semiconductor memory device group and a node to which a power supply potential VDD or a power supply potential VSS is supplied, as illustrated in FIG. 11B or FIG. 11C. Circuits illustrated in FIGS. 11B and 11C are described below.

FIGS. 11B and 11C each illustrate an example of a structure of a memory circuit including, as a switching element for controlling supply of a power supply potential to a semiconductor memory device, a transistor using an oxide semiconductor.

The memory device illustrated in FIG. 11B includes a switching element 1141 and a semiconductor memory device group 1143 including a plurality of semiconductor memory devices 1142. Specifically, as each of the semiconductor memory devices 1142, any of the semiconductor memory devices described in Embodiments 1 and 2 can be used. Each of the semiconductor memory devices 1142 included in the semiconductor memory device group 1143 is supplied with the high-level power supply potential VDD through the switching element 1141. Further, each of the semiconductor memory devices 1142 included in the semiconductor memory device group 1143 is supplied with a potential of a signal IN and the low-level power supply potential VSS.

In FIG. 11B, a transistor using a semiconductor with a large band gap such as an oxide semiconductor is used as the switching element 1141, and the switching of the transistor is controlled by a signal SigA supplied to a gate thereof.

FIG. 11B illustrates the structure in which the switching element 1141 includes one transistor; however, embodiments of the present invention are not limited to this structure, the switching element 1141 may include a plurality of transistors. In the case where the switching element 1141 includes a plurality of transistors which serves as switching elements, the plurality of transistors may be connected in parallel, in series, or in combination of parallel connection and series connection.

FIG. 11C illustrates an example of a memory device in which each of the semiconductor memory devices 1142 included in the semiconductor memory device group 1143 is supplied with the low-level power supply potential VSS through the switching element 1141. The supply of the low-level power supply potential VSS to each of the semiconductor memory devices 1142 included in the semiconductor memory device group 1143 can be controlled by the switching element 1141.

When a switching element is provided between a semiconductor memory device group and a node to which the power supply potential VDD or the power supply potential VSS is supplied, data can be retained even while operation of a CPU is temporarily stopped and the supply of the power supply voltage is stopped; accordingly, power consumption can be reduced. For example, while a user of a personal computer does not input data to an input device such as a keyboard, the operation of the CPU can be stopped, by which power consumption can be reduced.

Although the CPU is given as an example here, an embodiment of the present invention can also be applied to an LSI such as a digital signal processor (DSP), a custom LSI, or a field programmable gate array (FPGA).

This embodiment can be combined with any other embodiment as appropriate.

Embodiment 4

In this embodiment, examples of an electronic device to which any one of Embodiments 1 to 3 is applied are described.

Figure 12A:
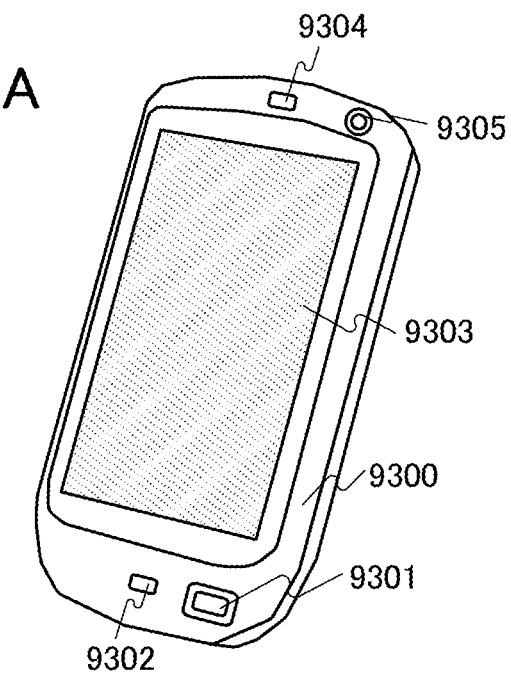
FIGS. 12A and 12B are perspective views each illustrating an example of an electronic device which is one embodiment of the present invention.

FIG. 12A illustrates a portable information terminal. The portable information terminal includes a housing 9300, a button 9301, a microphone 9302, a display portion 9303, a speaker 9304, and a camera 9305, and has a function as a mobile phone. One embodiment of the present invention can be applied to a CPU and a memory module inside the electronic device.

Figure 12B:
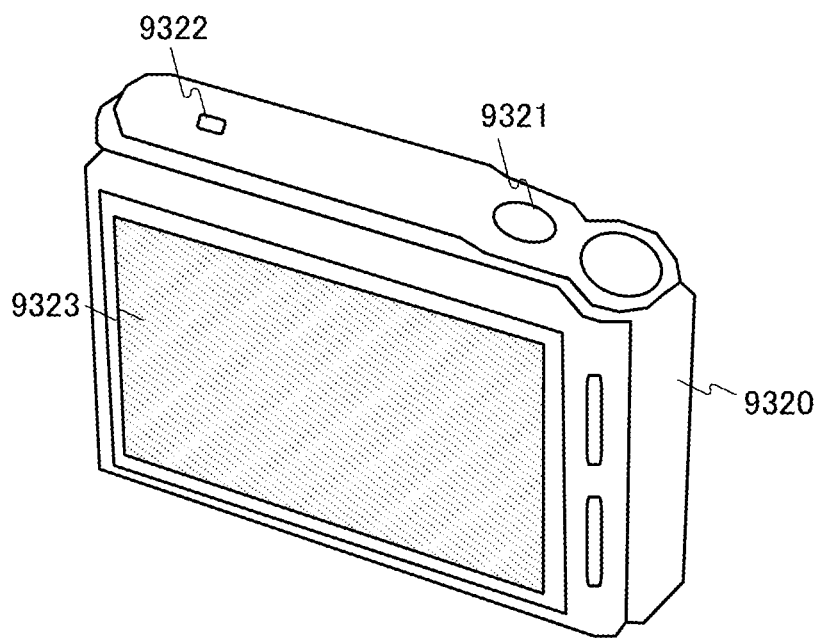

FIG. 12B illustrates a digital still camera. The digital still camera includes a housing 9320, a button 9321, a microphone 9322, and a display portion 9323. One embodiment of the present invention can be applied to a memory module inside the electronic device.

One embodiment of the present invention enables the quality of an electronic device to be improved. In addition, power consumption can be reduced, and reliability can be improved.

This embodiment can be combined with any other embodiment as appropriate.

This application is based on Japanese Patent Application serial no. 2011-112102 filed with Japan Patent Office on May 19, 2011, the entire contents of which are hereby incorporated by reference.

What is claimed is:

1. A method for manufacturing a semiconductor device, the method comprising the steps of:
    forming a first conductive layer and a second conductive layer over a substrate;
    forming a first insulating film covering the first conductive layer and the second conductive layer;
    forming a third conductive layer between the first conductive layer and the second conductive layer with the first insulating film interposed between the third conductive layer and each of the first conductive layer and the second conductive layer;
    forming a second insulating film over covering the first insulating film and the third conductive layer;
    removing part of the first insulating film and part of the second insulating film so as to expose a top surface of the first conductive layer and a top surface of the second conductive layer, thereby forming a first insulating layer in contact with a side surface of the first conductive layer and a side surface of the second conductive layer and a second insulating layer between the first conductive layer and the second conductive layer with the first insulating layer interposed between the second insulating layer and each of the first conductive layer and the second conductive layer;
    forming a first semiconductor layer over the first conductive layer, the second conductive layer, and the second insulating layer, wherein the first semiconductor layer is an oxide semiconductor layer and electrically connected to the first conductive layer and the second conductive layer;

forming a third insulating layer covering the first semiconductor layer;

forming a fourth conductive layer over the third conductive layer with the second insulating layer, the first semiconductor layer, and the third insulating layer interposed therebetween;

forming a fourth insulating layer covering the fourth conductive layer; and forming a fifth conductive layer over the second conductive layer and adjacent to a side surface of the fourth conductive layer with the fourth insulating layer interposed therebetween.

2. The method for manufacturing a semiconductor device according to claim 1, wherein the part of the first insulating film and the part of the second insulating film is removed so that the top surface of the first conductive layer, the top surface of the second conductive layer, and a top surface of the third insulating layer each have a same level.

3. The method for manufacturing a semiconductor device according to claim 1, wherein the part of the first insulating film and the part of the second insulating film is removed by a CMP method.

4. The method for manufacturing a semiconductor device according to claim 1, wherein the third conductive layer is formed so as to surround the second conductive layer.

5. The method for manufacturing a semiconductor device according to claim 1, wherein the oxide semiconductor layer comprises indium, gallium, and zinc.

6. The method for manufacturing a semiconductor device according to claim 1, wherein the first conductive layer and the second conductive layer are formed so that a length of the first conductive layer is larger than that of the second conductive layer.

7. The method for manufacturing a semiconductor device according to claim 1, further comprising the steps of:

forming a second semiconductor layer over the substrate; and forming a fifth insulating layer over the second semiconductor layer, wherein the fifth insulating layer includes an opening, wherein the first conductive layer is formed over the second semiconductor layer and in the opening of the fifth insulating layer, and wherein the second conductive layer is formed over the second semiconductor layer with the fifth insulating layer interposed therebetween.

8. The method for manufacturing a semiconductor device according to claim 7, wherein the second semiconductor layer comprises a first region overlapping with the first conductive layer and a second region overlapping with the second conductive layer, and wherein the first region has a lower resistivity than the second region.

9. The method for manufacturing a semiconductor device according to claim 7, wherein the first semiconductor layer comprises silicon.

10. A semiconductor device comprising:

a first conductive layer;

a second conductive layer;

a first insulating layer in contact with a side surface of the first conductive layer and a side surface of the second conductive layer;

a third conductive layer between the first conductive layer and the second conductive layer with the first insulating layer interposed between the third conductive layer and each of the first conductive layer and the second conductive layer;

a second insulating layer over the third conductive layer;

an oxide semiconductor layer over the first conductive layer, the second conductive layer, and the second insulating layer, wherein the oxide semiconductor layer is electrically connected to the first conductive layer and the second conductive layer;

a third insulating layer over the oxide semiconductor layer; and a fourth conductive layer over the third conductive layer with the second insulating layer, the oxide semiconductor layer, and the third insulating layer interposed therebetween, wherein the second insulating layer is provided between the first conductive layer and the second conductive layer with the first insulating layer interposed between the second insulating layer and each of the first conductive layer and the second conductive layer.

11. The semiconductor device according to claim 10, further comprising:

a fourth insulating layer over the second conductive layer and the fourth conductive layer; and a fifth conductive layer over the second conductive layer and adjacent to a side surface of the fourth conductive layer with the fourth insulating layer interposed therebetween.

12. The semiconductor device according to claim 1, wherein a top surface of the first conductive layer, a top surface of the second conductive layer, and a top surface of the second insulating layer each have a same level.

13. The semiconductor device according to claim 1, wherein the third conductive layer surrounds the second conductive layer.

14. The semiconductor device according to claim 1, wherein the oxide semiconductor layer comprises indium, gallium, and zinc.

15. The semiconductor device according to claim 1, wherein a length of the first conductive layer is larger than that of the second conductive layer.

16. The semiconductor device according to claim 1, wherein the semiconductor device is a memory device.

17. A semiconductor device comprising;

a first semiconductor layer;

a first insulating layer over the first semiconductor layer, wherein the first insulating layer includes an opening reaching the first semiconductor layer;

a first conductive layer over the first semiconductor layer and in the opening of the first insulating layer;

a second conductive layer over the first semiconductor layer with the first insulating layer interposed therebetween;

a second insulating layer over the first insulating layer and in contact with a side surface of the first conductive layer and a side surface of the second conductive layer;

a third conductive layer over the second insulating layer and between the first conductive layer and the second conductive layer with the second insulating layer interposed between the third conductive layer and each of the first conductive layer and the second conductive layer;

a third insulating layer over the third conductive layer;
a second semiconductor layer over the first conductive layer, the second conductive layer, and the third insulating layer, wherein the second semiconductor layer is an oxide semiconductor layer and electrically connected to the first conductive layer and the second conductive layer;
a fourth insulating layer over the second semiconductor layer;
a fourth conductive layer over the third conductive layer with the third insulating layer, the second semiconductor layer, and the fourth insulating layer interposed therebetween;
a fifth insulating layer over the second conductive layer and the fourth conductive layer; and
a fifth conductive layer over the second conductive layer and adjacent to a side surface of the fourth conductive layer with the fifth insulating layer interposed therebetween,
wherein the third insulating layer is provided between the first conductive layer and the second conductive layer with the second insulating layer interposed between the third insulating layer and each of the first conductive layer and the second conductive layer.

18. The semiconductor device according to claim 17,
wherein the first semiconductor layer comprises a first region overlapping with the first conductive layer and a second region overlapping with the second conductive layer, and
wherein the first region has a lower resistivity than the second region.

19. The semiconductor device according to claim 17, wherein a top surface of the first conductive layer, a top surface of the second conductive layer, and a top surface of the third insulating layer each have a same level.

20. The semiconductor device according to claim 17, wherein the third conductive layer surrounds the second conductive layer.

21. The semiconductor device according to claim 17, wherein the oxide semiconductor layer comprises indium, gallium, and zinc.

22. The semiconductor device according to claim 17, wherein a length of the first conductive layer is larger than that of the second conductive layer.

23. The semiconductor device according to claim 17, wherein the first semiconductor layer comprises silicon.

24. The semiconductor device according to claim 17, wherein the semiconductor device is a memory device.

* * * * *

UNITED STATES PATENT AND TRADEMARK OFFICE
CERTIFICATE OF CORRECTION

PATENT NO.        : 8,709,889 B2
APPLICATION NO.   : 13/471667
DATED             : April 29, 2014
INVENTOR(S)       : Toshihiko Saito It is certified that error appears in the above-identified patent and that said Letters Patent is hereby corrected as shown below:

IN THE SPECIFICATION:

Column 11, line 37, after "tetracoordinate" replace "0" with --O--;

Column 12, line 27, after "as" replace "In-o-based" with --In-O-based--;

Column 21, line 2, replace "theist" with --the 1st--;

Column 26, line 2, replace "Loy" with --Lov--;

Column 26, line 60, replace "Loy" with --Lov--;

Column 27, line 20, replace "Loy" with --Lov--;

Column 32, line 31, replace "UF" with --I/F--;

Column 32, line 32, replace "UF" with --I/F--;

IN THE CLAIMS:

Column 36, line 32, in claim 12 replace "1" with --10--;

Column 36, line 36, in claim 13 replace "1" with --10--;

Column 36, line 39, in claim 14 replace "1" with --10--;

Signed and Sealed this
Second Day of December, 2014

Michelle K. Lee
*Deputy Director of the United States Patent and Trademark Office*

CERTIFICATE OF CORRECTION (continued)
U.S. Pat. No. 8,709,889 B2

Column 36, line 43, in claim 15 replace "1" with --10--;

Column 36, line 46, in claim 16 replace "1" with --10--.